(12) United States Patent
Jung et al.

(10) Patent No.: US 9,431,245 B2
(45) Date of Patent: Aug. 30, 2016

(54) METHOD OF MANUFACTURING SEMICONDUCTOR DEVICE

(71) Applicant: SAMSUNG ELECTRONICS CO., LTD., Suwon-si, Gyeonggi-do (KR)

(72) Inventors: Jee-Eun Jung, Yongin-si (KR); Kyoung-Yun Baek, Suwon-si (KR); Jeong-Hoon Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 57 days.

(21) Appl. No.: 14/285,707

(22) Filed: May 23, 2014

(65) Prior Publication Data

US 2015/0104887 A1 Apr. 16, 2015

(30) Foreign Application Priority Data

Oct. 11, 2013 (KR) ........................ 10-2013-0121484

(51) Int. Cl.
| | | |
|---|---|---|
| *H01L 21/33* | (2006.01) | |
| *H01L 21/033* | (2006.01) | |
| *G03F 1/00* | (2012.01) | |
| *H01L 21/027* | (2006.01) | |
| *H01L 21/311* | (2006.01) | |
| *H01L 21/3213* | (2006.01) | |
| *H01L 21/66* | (2006.01) | |

(52) U.S. Cl.
CPC ............. *H01L 21/0338* (2013.01); *G03F 1/00* (2013.01); *H01L 21/0274* (2013.01); *H01L 21/31144* (2013.01); *H01L 21/32139* (2013.01); *H01L 22/12* (2013.01)

(58) Field of Classification Search
CPC ... H01L 22/12; H01L 22/20; H01L 438/942; Y10S 438/942; Y10S 438/943; Y10S 438/944; Y10S 438/947; Y10S 430/05; G03F 1/00; G03F 1/0007; G03F 1/0015; G03F 1/0023; G03F 1/003; G03F 1/0038; G03F 1/142; G03F 1/144; G03F 1/146; G03F 1/148; G03F 1/16; G03F 1/20; G03F 1/22; G03F 1/24; G03F 1/26; G03F 1/28; G03F 1/29; G03F 1/30; G03F 1/32; G03F 1/34; G03F 1/36; G03F 1/38; G03F 1/40; G03F 1/42; G03F 1/44
See application file for complete search history.

(56) References Cited

U.S. PATENT DOCUMENTS

| | | | |
|---|---|---|---|
| 8,151,222 B2 | 4/2012 | Kim | |
| 8,402,396 B2 | 3/2013 | Kahng et al. | |
| 2010/0086863 A1* | 4/2010 | Hsu .......................... | G03F 1/144 430/5 |
| 2011/0245949 A1* | 10/2011 | Chih ...................... | G03F 1/144 700/97 |
| 2012/0196230 A1 | 8/2012 | Cho et al. | |
| 2013/0003108 A1* | 1/2013 | Agarwal ............. | G03F 7/70466 358/1.15 |
| 2013/0007674 A1 | 1/2013 | Abou Ghaida et al. | |

(Continued)

*Primary Examiner* — William F Kraig
*Assistant Examiner* — Stanetta Isaac
(74) *Attorney, Agent, or Firm* — Volentine & Whitt, PLLC

(57) ABSTRACT

A method of manufacturing a semiconductor device includes generating a mask layout of patterns in which the distance between adjacent ones of the patterns is equal to or less than a resolution of a lithography process, the patterns are apportioned among a plurality of masks such that in each of the masks the space between adjacent ones of the patterns is greater than the resolution, and a dual pattern is added to one of the masks. A semiconductor pattern is formed on a substrate using the mask(s) and the mask to which the dual pattern has been added. Patterns having a pitch equal to or less than the resolution may be formed on the semiconductor device.

19 Claims, 26 Drawing Sheets

(56) References Cited

U.S. PATENT DOCUMENTS

| | | |
|---|---|---|
| 2013/0024822 A1 | 1/2013 | Hsieh et al. |
| 2013/0061183 A1* | 3/2013 | Abou Ghaida ..... G06F 17/5068 716/52 |
| 2013/0236836 A1* | 9/2013 | Sun .......................... G03F 7/70 430/322 |
| 2013/0244427 A1* | 9/2013 | Yuan ......................... G03F 1/70 438/689 |

* cited by examiner

120A/120TA

120A/120TA

METHOD OF MANUFACTURING SEMICONDUCTOR DEVICE

PRIORITY STATEMENT

This application claims priority under 35 U.S.C. §119 to Korean Patent Application No. 10-2013-0121484 filed on Oct. 11, 2013, the disclosure of which is hereby incorporated by reference in its entirety.

BACKGROUND

1. Field

The inventive concept relates to the manufacturing of semiconductor devices. In particular, the inventive concept relates to the process of photolithography used to form fine patterns of semiconductor devices.

2. Description of Related Art

The scaling down of semiconductor devices to meet the demand for more compact and more highly functional electronic devices requires a decrease in the size and pitch of certain features of the semiconductor devices. Thus, the field of manufacturing semiconductor devices includes research into techniques of forming fine patterns, namely, circuit patterns, of the devices. A principal one of these techniques for forming a circuit pattern is photolithography or simply lithography. Semiconductor device lithography generally includes a process of coating a semiconductor wafer with photoresist, an exposure process of exposing the photoresist to an image of a circuit pattern, and a developing process of selectively removing (exposed or non-exposed) portions of the exposed photoresist to form a photoresist pattern. The exposure process includes projecting light onto the wafer through a lithography mask having features corresponding to the circuit pattern.

An etching process is carried out subsequent to the lithography process. The etching process includes etching a layer(s) beneath the photoresist pattern using the photoresist pattern as an etch mask.

In this way, the pattern of the lithography mask is transcribed onto the wafer.

SUMMARY

According to an aspect of the inventive concept, there is provided a method of manufacturing a semiconductor device, which includes using a computer program to generate an original layout of patterns wherein adjacent ones of the patterns are spaced from each other by a distance equal to or less than a resolution of a lithography process, fabricating a plurality of lithography masks, including by apportioning the patterns of the original layout among the lithography masks in such a way that the lithography masks have mask patterns derived from the original layout, and in each of the lithography masks adjacent ones of said mask patterns are spaced by a distance greater than the resolution, and incorporating a dual pattern into one of the lithography masks, the dual pattern corresponding to at least part of one of said mask patterns of another of the lithography masks, and forming a semiconductor pattern on a substrate using all of the lithography masks including that having the dual pattern.

According to another aspect of the inventive concept, there is provided a method of fabricating a set of lithography masks, which includes producing an original mask layout including patterns between which a space is equal to or less than a resolution of a lithography process, separating the patterns into first respective and second respective ones of the patterns based on whether distances between adjacent ones of the patterns are each greater than the resolution, fabricating a first mask having first patterns corresponding to the first respective patterns of the original mask layout, and a second mask having second patterns corresponding to the second respective patterns of the original mask layout, and in which the fabricating of the second mask also includes forming in the second mask a dual pattern corresponding to at least part of one of the first respective patterns of the original mask layout, in a region of the second mask where a distance from one of the second patterns before arriving at any other of the second patterns is greater than twice the resolution, and in which contours of the first and second masks, which are simulated according to process variations, are substantially the same.

According to still another aspect of the inventive concept, there is provided a method for use in manufacturing a semiconductor device, which includes generating an original mask layout including patterns between which a space is equal to or less than a resolution of a lithography process, determining a distance between the pattern and a pattern adjacent thereto in the layout for each of the patterns, apportioning the patterns among a plurality of layouts, respectively, based on whether the distances between adjacent ones of the patterns of the original mask layout are each greater than the resolution, and fabricating a plurality of masks, and in which the fabricating of the masks includes fabricating a first mask so as to have first patterns conforming to a first one of the layouts, fabricating a second mask so as to have second patterns conforming to a second one of the layouts, and so to have a dual pattern whose size and shape are the same as those of at least part of one of the first patterns of the first mask, and such that the dual pattern is formed at a relative location in the second mask corresponding to that of said one of the first patterns in the first mask. Thus, the dual pattern of the second mask and said one of the first patterns of the first mask overlap in a plan view in which the first and second masks are vertically aligned.

BRIEF DESCRIPTION OF THE DRAWINGS

The foregoing and other features and advantages of the inventive concept will be apparent from the more particular description of preferred embodiments of the inventive concept, as illustrated in the accompanying drawings. The drawings are not necessarily to scale, emphasis instead being placed upon illustrating the principles of the inventive concept. In the drawings.

DETAILED DESCRIPTION OF THE PREFERRED EMBODIMENTS

Figure 1:
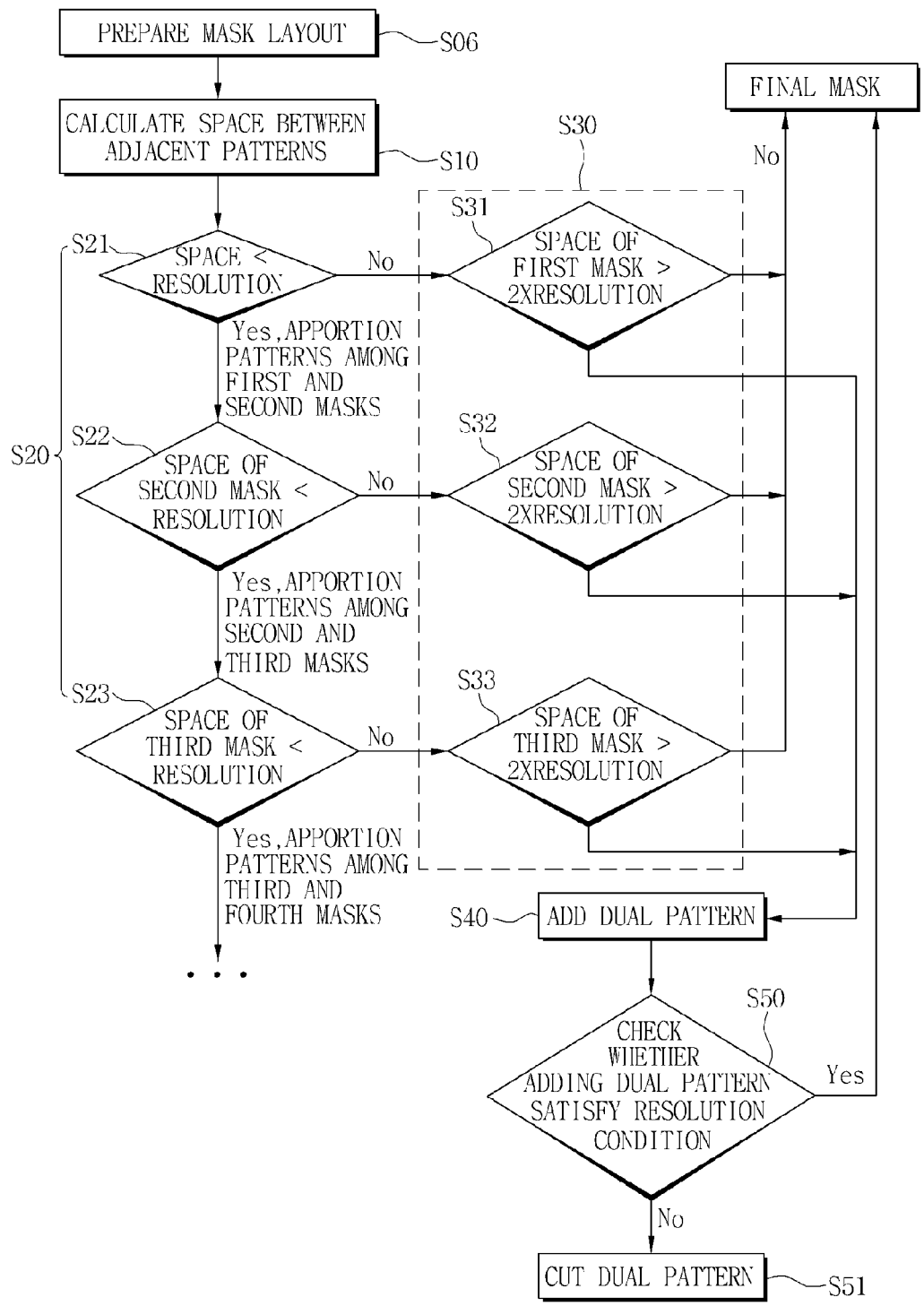
FIG. 1 is a flowchart illustrating a method of fabricating a set of lithography masks for use in manufacturing a semiconductor device according to the inventive concept.

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, like numerals are used to designate like elements throughout the drawings.

It will be understood that although the terms first, second, third etc. are used herein to describe various elements, regions, layers, etc., these elements, regions, and/or layers are not limited by these terms. These terms are only used to distinguish one element, layer or region from another.

Other terminology used herein for the purpose of describing particular examples or embodiments of the inventive concept is to be taken in context. For example, the terms "comprises" or "comprising" when used in this specification specifies the presence of stated elements, features or processes but does not preclude the presence or additional elements, features or processes. The term "pattern" may be used to describe a feature of a mask or a feature that is produced using the mask in a lithography process (e.g., may be used to describe a single line), or may at times be used to describe an entire set of features (e.g., the openings of a patterned resist layer or horizontally spaced apart features formed on a semiconductor substrate), as will be clear in context. Also, the dimensions or distances described will generally relate to dimensions in a given direction as is made clear from the drawings. In this respect, the term "distance" will be understood as generally referring to the shortest straight line distance between features.

A method of fabricating a set of lithography masks for use in manufacturing a semiconductor device according to the inventive concept will now be described in detail with reference to the flowchart of FIG. 1.

The method begins with the preparing of a mask layout (operation S06). A designer may design the mask layout using a design tool (software). The mask layout includes a plurality of patterns.

The spaces between adjacent patterns of the mask layout are measured (operation S10). The space between adjacent patterns may be the shortest distance between outermost edges of the respective patterns.

When such a distance(s) between adjacent patterns has a value that is at or less than the limit of the resolution of the lithography equipment to be used in forming the semiconductor device (referred to hereinafter as simply the "resolution"), the two patterns cannot be used together in the same mask or else the mask will be ineffective. Therefore, the mask layout is apportioned among first and second "preliminary" masks (operation S21), i.e., first and second mask layouts are devised. In this operation, either of the adjacent patterns may be omitted from the mask layout (whereby the mask layout becomes the first mask layout) and incorporated into the second mask layout. The patterns remaining in the mask layout may be referred to as first patterns. A first mask including the first patterns (first final mask) may be formed (but see the description of operation S30 below). In this case, as should be clear from the description above, the distances between adjacent ones of the first patterns are each greater than the resolution.

Likewise, when the space between adjacent patterns of the second mask layout has a value that is at or less than the resolution, the two patterns cannot be used in the same mask or else the mask will be ineffective. Instead, the second mask layout is apportioned between the preliminary second mask and a preliminary third mask (operation S22), i.e., the second mask layout is revised and a third mask layout is devised. In this operation, either of the two patterns may be removed from the second mask layout and incorporated into the third mask layout. Patterns remaining in the second mask layout may be referred to as second patterns.

The above-described mask layout apportioning operation (operation S20) is basically repeated until each space between the adjacent patterns in the mask layouts ("preliminary masks") is greater than the resolution.

Once this condition is satisfied, a determination is made as to whether the distance between adjacent patterns in any of the mask layouts is at least twice the resolution (operation S30). Any mask layout including adjacent patterns spaced apart by a distance at least twice the resolution limit is selected from among the mask layouts produced by the mask layout apportioning operation (operation S20). Then, a pattern(s) in an unselected mask layout may be added to the selected mask layout between the patterns whose spacing is determined to be twice the resolution (operation S40). A pattern included in both the selected mask and the unselected mask will be referred to as a dual pattern.

Then, a determination is made as to whether the distance between the dual pattern and a second pattern adjacent thereto is equal to or less than the resolution (operation S50). If so, then that portion of the dual pattern which is spaced from the second pattern by a distance equal to or less than the resolution is cut (operation S51), i.e., is removed from the mask layout having the dual pattern to revise that mask layout. A final mask having the revised mask layout may then be formed.

Hereinafter, the reason behind operation S30 will be described.

The resolution may range from about 100 nm to about 500 nm. The resolution in this range is for a region of a mask in which the density of the patterns is about 60%. When a mask has a pattern density of less than 60%, an image of the patterns does not have sufficient contrast even if an image of the patterns is transferred a distance longer than the resolution.

A graph of the critical dimensions (CD) of photoresist patterns having the same sizes but with different distances between the patterns shows that the CD varies with an increase in distance between the patterns. This characteristic of the semiconductor lithography process is known as pitch linearity. When the distance between the patterns reaches a predetermined distance of, for example, about 600 to 1000 nm or more, differences in the spacing between adjacent patterns of the mask no longer produce corresponding differences in the CDs of adjacent features of the photoresist pattern. When two different patterns are formed in a region in which patterns do not affect CDs of the adjacent features of the photoresist pattern, an optical proximity effect will not occur.

The distance between the patterns at which the patterns do not affect the CDs may be determined from scanning electron microscope (SEM) observations. The resolution generally depends on the type of light source for generating the exposure light, the depth of focus (DOF), the mask size, and the pattern density of the mask. When patterns are formed in a region in which the distance between the patterns is equal to or more than twice the resolution, an optical proximity effect tends not to occur during a photolithography process. When the optical proximity effect does not occur, the shape of features of the photoresist pattern may be distorted.

Figure 2:
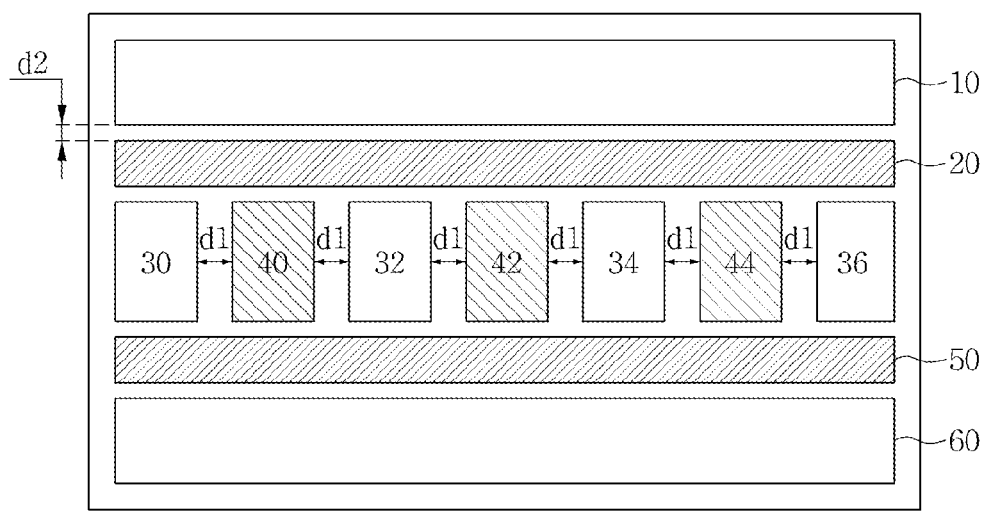
FIG. 2 is a plan view of an original mask layout in a method of manufacturing a semiconductor device according to the inventive concept.

FIG. 2 illustrates an example of the mask layout that may be used in a method of manufacturing a semiconductor device according to the inventive concept.

Referring to FIGS. 1 and 2, the mask layout prepared in this example (operation S06) includes a fourth line pattern 50, a plurality of contact patterns, a third line pattern 20, and a first line pattern 10 adjacent a second line pattern 60. The plurality of contact patterns in this example include a plurality of patterns 30, 40, 32, 42, 34, 44, and 36 of the same shape and arranged at regular intervals. The interval between adjacent ones of the plurality of contact patterns 30, 40, 32, 42, 34, 44, and 36 is designated a first distance d1 for purposes of this description and is a distance measured in operation S10.

The first line pattern 10 may have the same width and length as the second line pattern 60. The third line pattern 20 may be formed adjacent to the first line pattern 10. The third line pattern 20 may have a smaller width than the first and second line patterns 10 and 60 and the same length as the first and second line patterns 10 and 60. The interval between the third line pattern 20 and the first line pattern 10 is designated a second distance d2 for purposes of this description and is a distance measured in operation S10.

A case will be described in which each of the first and second distances d1 and d2 has a value less than the resolution of the photolithography process.

In this case, if the photolithography process for transferring an image of the first line pattern 10 and the third line pattern 20 to a layer of photoresist on a wafer were carried out, the image would not have a sufficient contrast due to the resolution that can be obtained by the photolithography process. On the same principle, an image of the first contact pattern 30 and a second contact pattern 40 would not have a sufficient contrast because the first contact pattern 30 and second contact pattern 40 are spaced apart by a distance shorter than the resolution. In other words, in this case, the conditions necessary for the photolithography process to attain a proper resolution (referred to hereinafter as "resolution conditions") are not satisfied.

Accordingly, it is determined that the mask layout has adjacent patterns spaced by a distance equal to or less than the resolution (operation S21). As a result, the mask layout is apportioned among the layouts of preliminary first and second masks (masks under design), respectively. Nonetheless, a space between the patterns of any one mask layout may still be equal to or less than the resolution. In this example, though, the space between patterns of the first mask layout will happen to be equal to or greater than the resolution.

The masks under design may be light blocking masks. However, the same principle may be applied to light transmission masks (denoted by 110T or 120T). In the case of a light transmission mask 110T, the first and second line patterns 10 and 60 would each be a pattern that transmits the exposure light, i.e., a light transmission pattern.

Figure 3:
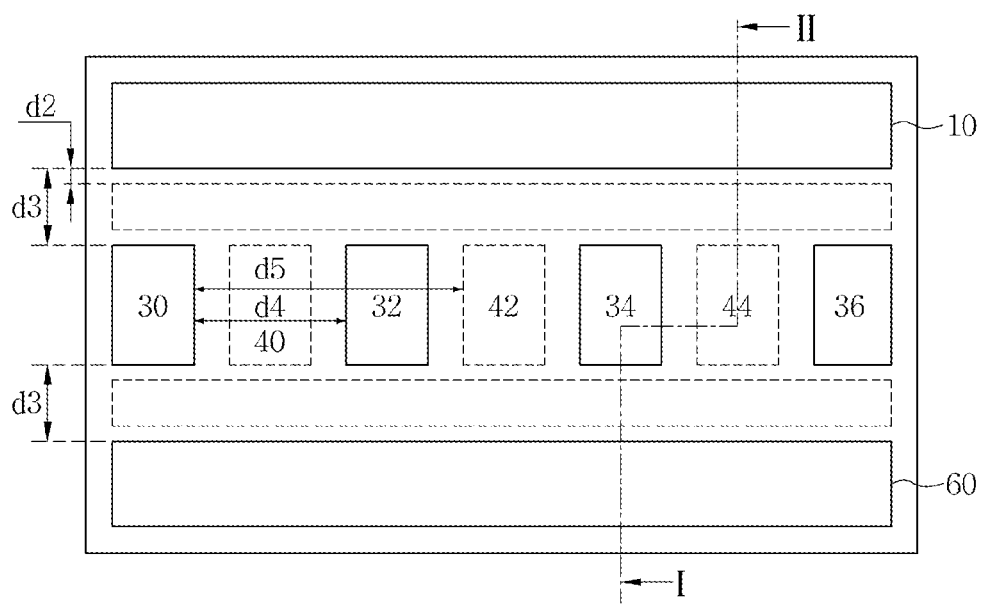
FIGS. 3, 4, 5, 6 and 7 are mask layout diagrams, including plan views of final masks fabricated, in a method according to the inventive concept.

FIG. 3 illustrates a process of forming a final first mask based on the mask layout of FIG. 2. As mentioned above, the first mask may be a light blocking mask 110 or a transmission mask 110T.

Referring to FIGS. 1 and 3, the first line pattern 10 and third line pattern 20 do not satisfy the resolution conditions (operation S21) because the distance d2 between the first line pattern 10 and a third line pattern 20 is too small, i.e., is less than the resolution. Thus, the third line pattern 20 is omitted from the first mask 110. On the other hand, the distance d3 between the first line pattern 10 and the first contact pattern 30 is greater than the resolution. Therefore, the first contact pattern 30 is included in the first mask 110.

The second line pattern 60 and the first contact pattern 30 in this example are also spaced the distance d3 apart from each other. Therefore, the resolution conditions are satisfied with respect to the second line pattern 60 and the first contact pattern 30. Accordingly, the second line pattern 60 is included in the first mask 110.

Furthermore, a determination is made as to whether the second contact pattern 40 should be included in the first mask 110 even though the second contact pattern 40 is spaced the third distance d3 from each of the first and second line patterns 10 and 60, i.e., even though the resolution conditions are satisfied with respect to these patterns. However, the second contact pattern 40 is spaced the first distance d1 apart from the first contact pattern 30. Accordingly, the second contact pattern 40 is omitted from the first mask 110 and provided in a second mask as described below with reference to FIGS. 4-6.

The third contact pattern 32 is spaced the third distance d3 apart from the first line pattern 10 and thus, the resolution conditions are satisfied with respect to these patterns. Also, the third contact pattern 32 is spaced a fourth distance d4, longer than the third distance d3, from the first contact pattern 30. However, in this case, the fourth distance d4 is not greater than twice the resolution and thus, may give rise to an optical proximity effect.

A fourth contact pattern 42 is considered for inclusion in the first mask 110. The fourth contact pattern 42 satisfies resolution conditions along with the first line pattern 10 but not with the third contact pattern 32. Therefore, only one of the third contact pattern 32 and the fourth contact pattern 42 is determined as appropriate for inclusion in the first mask 110. In this case, the fourth contact pattern 42 is spaced a distance d5 from the first contact pattern 30 that is greater than twice the resolution, unlike the third contact pattern 32. Therefore, the third contact pattern 32 is included in the first mask 110 rather than the fourth contact pattern 42.

The examination of the resolution conditions (S21, S31) is carried out with respect to the remainder of the patterns of the mask layout (FIG. 2). As a result, the first mask 110 is formed to include the first and second line patterns 10 and 60, and the first, third, fifth, and seventh contact patterns 30, 32, 34, and 36.

Figure 4:
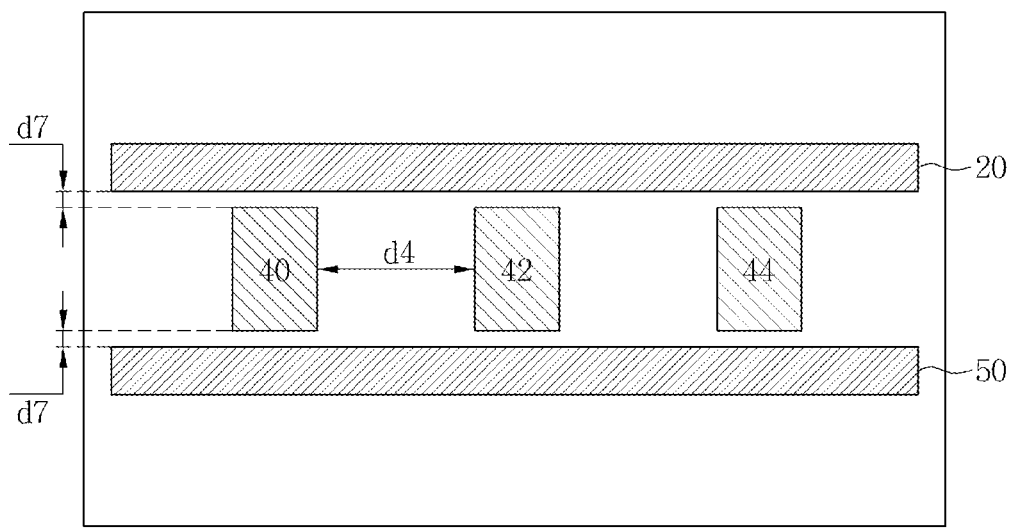

FIG. 4 shows the patterns of the mask layout omitted from the first mask 110/110T, i.e., a preliminary second mask 120A/120T.

Referring to FIGS. 1 and 4, the preliminary second mask 120A/120T includes the third line pattern 20, fourth line pattern 50, second contact pattern 40, fourth contact pattern 42, and sixth contact pattern 44. The adjacent ones of the patterns are examined as to the resolution conditions (S22, S32) to determine which of the patterns are to be included in the second mask 120/120T (FIG. 6).

Figure 5:
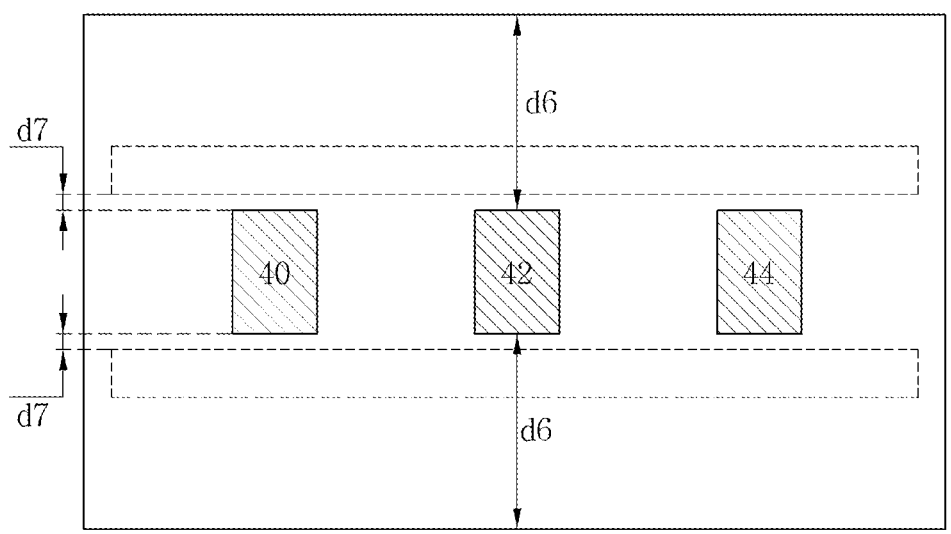

More specifically, referring to FIGS. 1 and 5, the third line pattern 20 is spaced a distance d7 from the second contact pattern 40 that is less than the resolution. Accordingly, the second contact pattern 40 does not satisfy the resolution conditions with respect to the third line pattern 20. Likewise, the fourth contact pattern 42 does not satisfy the resolution conditions with respect to the third line pattern 20. The third line pattern 20 and the fourth line pattern 50 are thus omitted from the second mask 120/120T (FIG. 6).

Also, a determination is made as to whether a space greater than twice the resolution is present in the preliminary second mask 120A/120TA (operation S32). In this example, such a space between the second contact pattern 40, the fourth contact pattern 42, and the sixth contact pattern 44 and the upper and lower sides of the second mask 120A/120TA exists as distance d6. Such a spacing equal to or more than twice the resolution may not be present from or between adjacent patterns, namely, the second, fourth, and sixth contact pattern 40, 42, and 44 in this example for reasons explained above with respect to the optical proximity effect. Therefore, in this case, it is determined that a dual pattern(s) should be included in the second mask (operation S40).

Figure 6:
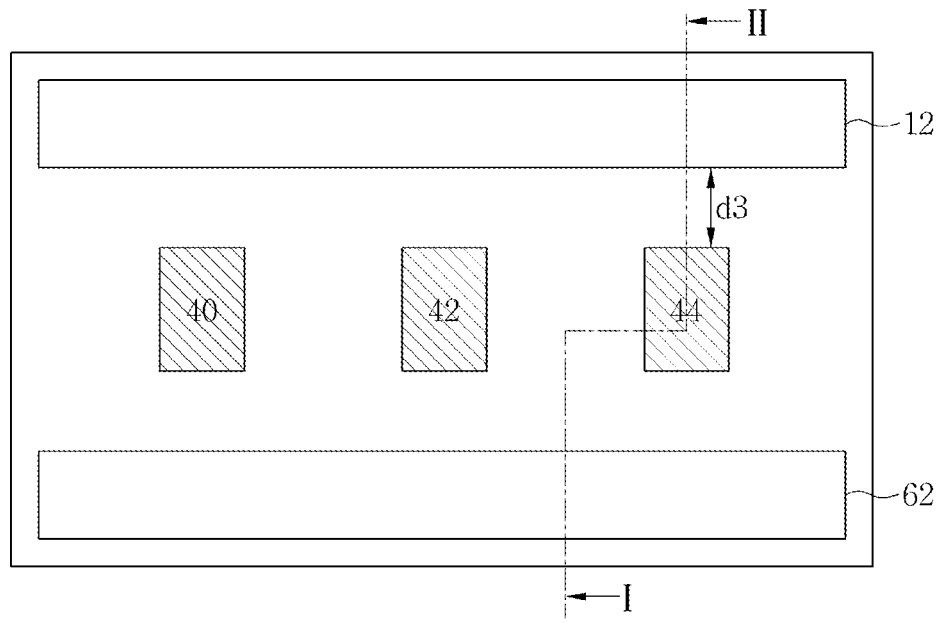

FIG. 6 shows the second mask 120/120T provided with dual patterns, according to an aspect of the inventive concept.

Referring to FIGS. 1 and 6, the second mask 120/120T includes a dual first line pattern 12, a dual second line pattern 62, the second contact pattern 40, the fourth contact pattern 42, and the sixth contact pattern 44. The dual first line pattern 12 and the dual second line pattern 62 have the same layout (size, shape and relative positions) as the first line pattern 10 and the second line pattern 60, respectively.

In other words, each of the first and second line patterns 10 and 60 are provided as a dual pattern because each of the first line pattern 10 and the second line pattern 60 is spaced the distance d3 from each of the second contact pattern 40, the fourth contact pattern 42, and the sixth contact pattern 44, and the distance d3 is less than or equal to the resolution.

Also, in this case, the pattern density of the preliminary second mask 120A turns out to be about 20% less than that of the first mask 110/110T. When the dual first line pattern 12 and the dual second line pattern 62 having the same layout as the first and second line patterns 10 and 60 are added to the preliminary second mask 120A/120AT having a low pattern density, the difference in pattern densities between the first mask 110/110T and the resulting second mask 120/120T is reduced. In fact, in this way the first mask 110/110T and the second mask 120/120T may have substantially the same pattern densities.

Figure 7:
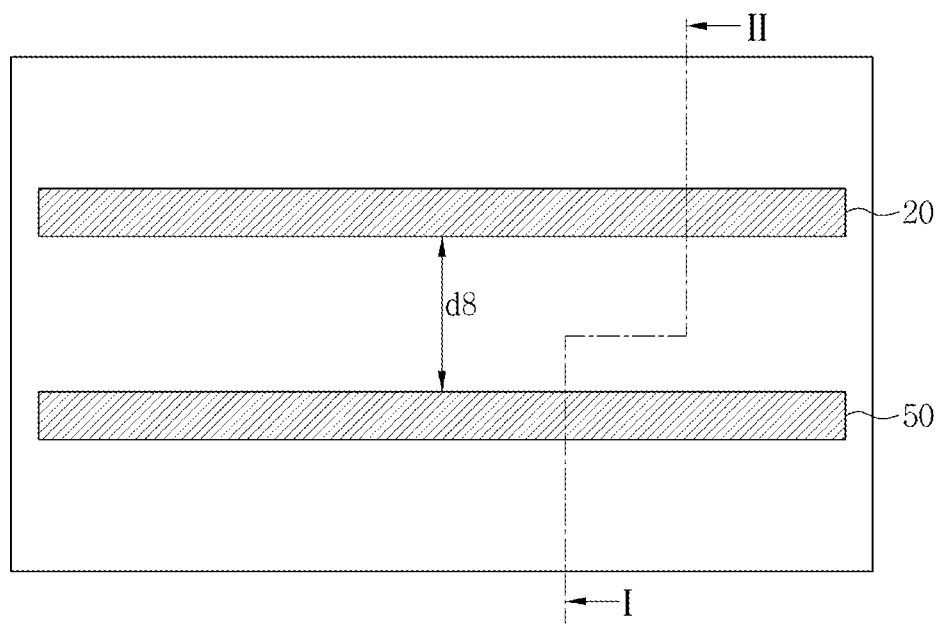

FIG. 7 illustrates the patterns of the mask layout that are omitted from the first and second masks, and which are thus provided in the third mask 130/130T.

Specifically, and with reference to FIGS. 1 and 7, the third mask 130/130T in this example includes the third line pattern 20 and fourth line pattern 50 because the distance d8 between the third line pattern 20 and the fourth line pattern 50 satisfies the resolution conditions and process conditions (S23 and S33).

Next, and although not shown in the flowchart of FIG. 1, the first, second and third masks 110, 100T, 120/120T and 130/130T are used by an exposure apparatus to carry out a lithographic process of exposing a layer of photoresist to the patterns of the masks 110, 100T, 120/120T and 130/130T. Then the layer of photoresist is developed to form a photoresist (PR) pattern and a layer(s) beneath the photoresist layer is etched using the PR pattern as mask. Accordingly, a pattern corresponding the mask layout (FIG. 1) is transcribed to the wafer, i.e., a semiconductor manufacturing process is performed using the masks.

Note, the example of the method described above includes providing a dual pattern(s) in the final set of masks fabricated for use in a lithography process, wherein each dual pattern has the same size and shape as one of the patterns of the original mask layout (FIG. 1). Next, other examples of the method will be described below with reference to FIGS. 8 and 9.

Figure 8:
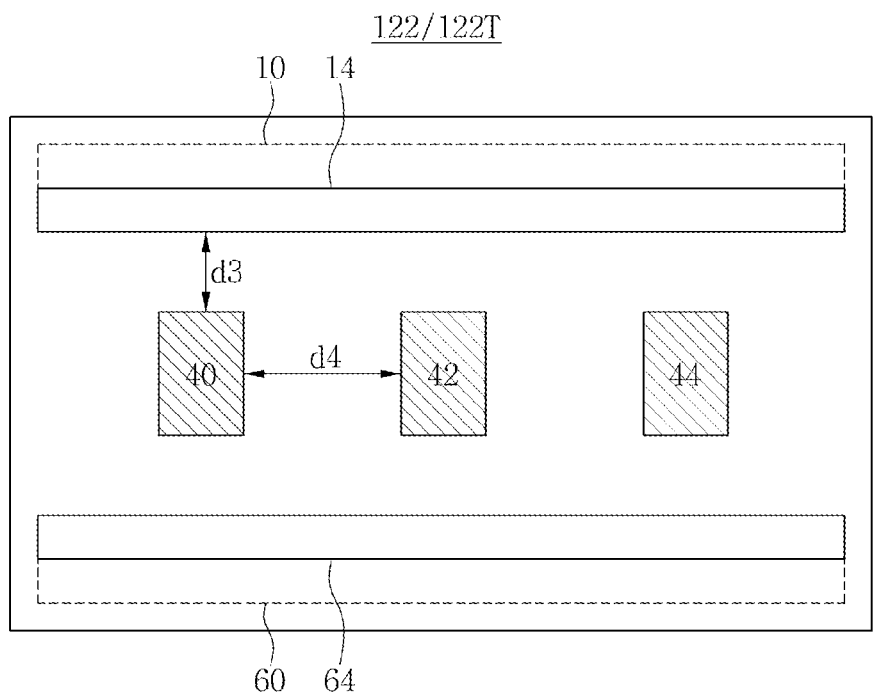
FIGS. 8 and 9 are plan view of examples of masks having a dual pattern in a method of manufacturing a semiconductor device according to the inventive concept.
Figure 9:
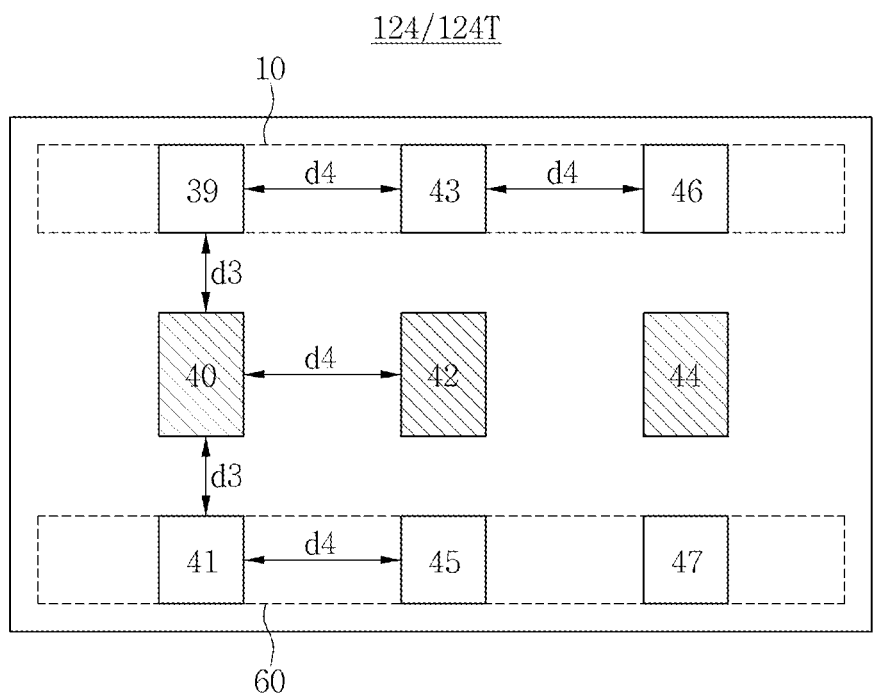

FIGS. 8 and 9 illustrate examples in which a plurality of the finalized masks include a dual pattern(s) that is different from the corresponding pattern of the original mask layout.

Referring to FIG. 8, in this example of the method according to the inventive concept, a modified second mask 122/122T is fabricated to include a fifth line pattern 14, a sixth line pattern 64, and the second, fourth, and sixth contact patterns 40, 42, and 44. The fifth and sixth line patterns 14 and 64 correspond to portions of the dual first and second line patterns 12 and 62, and the patterns of the modified second mask 122/122T have the same spacing as that between the first and second line patterns 12 and 62 and the second, fourth, and sixth contact patterns 40, 42, and 44. In particular, the fifth line pattern 14 is spaced distance d3 apart from each of the second contact pattern 40, the fourth contact pattern 42, and the sixth contact pattern 44. Therefore, the resolution conditions are satisfied with respect to these patterns. Also, the distances between patterns of the modified second mask 122/122T are not equal to or greater than twice the resolution.

FIG. 9 shows another example of a second mask 124/124T having dual patterns which correspond to parts of the first and second line patterns 12 and 62.

In this example, though, the dual patterns include an eighth contact pattern 39, a ninth contact pattern 43, and a tenth contact pattern 46 (corresponding to respective parts of the first line pattern 10 illustrated with a dotted line). Adjacent ones of the eighth contact pattern 39, the ninth contact pattern 43, and the tenth contact pattern 46 are spaced the distance d4 from one another. Therefore, the resolution conditions are satisfied with respect to these patterns. Furthermore, and as a result, the eighth contact pattern 39 is spaced the distance d3 from the second contact pattern 40, the ninth contact pattern 43 is spaced the distance d3 from the fourth contact pattern 42, and the tenth contact pattern 46 is spaced the distance d3 from sixth contact pattern 44. When such spaces between the adjacent patterns is constant, a process margin is ensured. The above-described designing of the second mask as necessitating a dual pattern may likewise be applied to the region on the other side of the contact patterns 40, 42 and 44. As a result, an eleventh contact pattern 41, a twelfth contact pattern 45, and a thirteenth contact pattern 47 corresponding to respective parts of the second line pattern 60 are provided. The spacing between adjacent ones of the ninth, tenth, and eleventh contact patterns 39, 43, and 45 in this example is also substantially equal to the spacing d4 between adjacent ones of the contact patterns 40, 42, and 44. Thus, the ninth, tenth, and eleventh contact patterns 39, 43, and 45 are also spaced the distance d3 from the contact patterns 40, 42, and 44, respectively.

Hereinafter, a technique of estimating the capability, i.e., the effectiveness, of the masks in a method according to the inventive concept, will be described with reference to FIGS. 10-14.

As described above, patterns of an original mask layout are apportioned to form a plurality of masks and this method may include devising a plurality of "preliminary" masks which are essentially no more than just layouts of some of the patterns of the original mask layout. The process windows of the first and preliminary second masks 110/110T, 120A/120T may be checked. The dual pattern may be added to the preliminary second mask 120A/120T, and process windows of the first and second masks may be checked. By checking the process windows, the capability of each of the masks may be estimated. The process window may include dose and defocus information regarding each process, by which the same critical dimension (CD) is produced. When a mask has a large process window, the mask is deemed as having a good process capability.

The process window may include process variation (PV) band data.

To estimate process capability in a lithography process, a simulation is performed. When a lithography process using a particular mask is simulated, a target layer 90 and contours 70 and 80 may be formed.

As was described in detail earlier with reference to FIGS. 1-9, a mask layout including patterns spaced apart by a distance equal to or less than the resolution may be apportioned to produce first through third masks. Adjacent patterns in each of the first through third masks are spaced by a distance greater than the resolution, and at least one of the patterns of the first through third masks is provided in a region where otherwise the space between adjacent patterns would exceed twice the resolution. Thus, a difference in simulated contour may be reduced according to process variations in the first through third masks (a first exposure process using the first mask, a second exposure process using the second mask, and a third exposure process using the third mask). Contours may be substantially equalized according to the process variations.

A contour simulated according to the process variability refers to a PV band.

The PV band may vary according to the dose of a lithography process, a focus, and a mask size. When the PV band is large, results of the lithography process may differ from results produced using a mask whose pattern has the original layout, according to process variations. To stably perform the lithography process, the PV band may have a small value.

Figure 10:
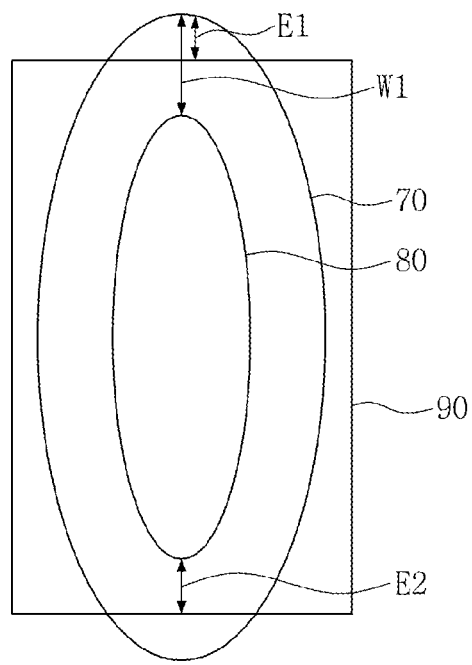
FIG. 10 is a diagram showing a method of analyzing a simulated contour in a method of manufacturing a semiconductor device according to the inventive concept.

FIG. 10 shows a method of analyzing a simulated contour in a method of manufacturing a semiconductor device according to the inventive concept.

Referring to FIG. 10, a simulated contour may include two ellipses.

Among the two ellipses, a small ellipse will be referred to as an inner contour 80, and a large ellipse will be referred to as an outer contour 70. Half a difference in the length of a major axis between the inner contour 80 and the outer contour 70 will be defined as a width of the PV band. An extent to which the inner contour 80 overlaps the outer contour 70 will be defined as an overlap ratio. When a mask design layout is most desirable, as results of simulation, the inner and outer contours 80 and 70 will have the same shape, and the overlap ratio will be 1.

Since a lithography process cannot be precisely estimated using only data regarding the inner contour 80 and the outer contour 70, values E1 and E2 are discerned to make a comparison with the target layer 90.

The PV band (or contour according to process variations) may be expressed by process variability scores (PVS).

The PVS may be determined from Equation 1:

$$PVS = S_2 \cos \theta + jS_2 \sin \theta \quad (1),$$

wherein $S_1 = (E1^2 - E2^2)/(E1^2 + E2^2)$, $S_2 = (E1^2 + E2^2 + W1^2)^{0.5}$, $\theta = \sin^{-1} S_1$, E1 is the distance between the outer contour 70 and the target layer 90, and E2 is the distance between the inner contour 80 and the target layer 90.

In this example, the target layer 90 may be a photoresist layer.

W1 is the width of the PV band. When a mask layout is designed, to optimize process conditions, the PV band may be controlled such that $S_1$ becomes 0, and $S_2$ has a minimum value. It may be concluded that the PV band is a range within which light is transferred when process conditions are performed.

According to one aspect of the inventive concept, a dual pattern is provided and dual exposure conditions may be utilized to reduce a PV band and improve a focus process margin. Also, an etch skew, which is a numerical value by which an etch loading effect may be estimated, may be made constant.

Since the PVS includes information regarding the distance between the target layer 90 and each of the inner and outer contours 80 and 70, the PVS may be checked as process conditions are changed. Although a case in which the patterns are contact patterns has been described as an example, it would be obvious to those of ordinary skill in the art that even if the patterns are line patterns, an inner outer and an outer contour may be defined and analyzed. Thus, a detailed description thereof will be omitted.

Figure 11:
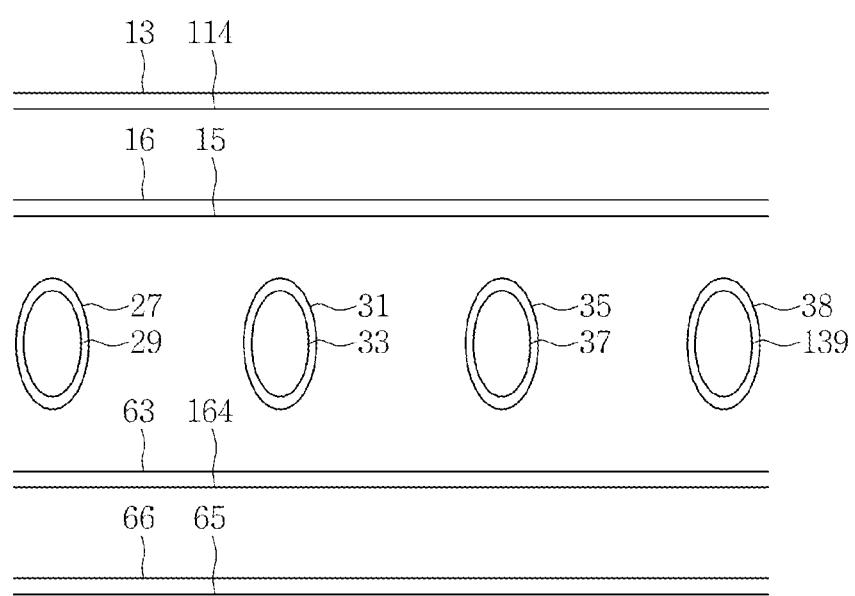
FIGS. 11, 12 and 13 are diagrams of simulated contours of masks of FIGS. 3, 6, and 7.
Figure 12:
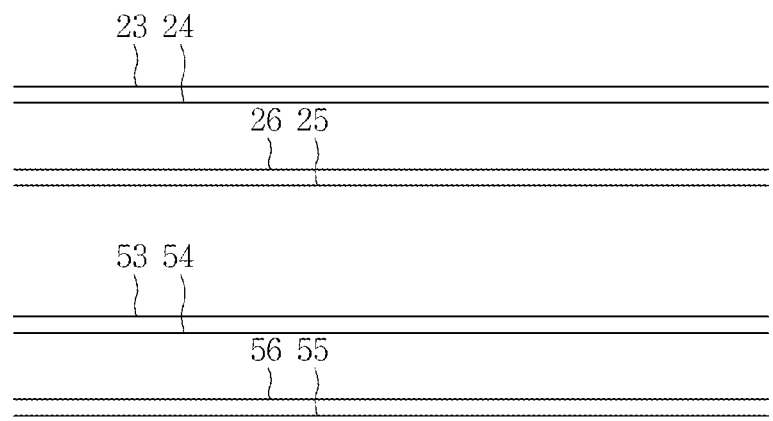
Figure 13:
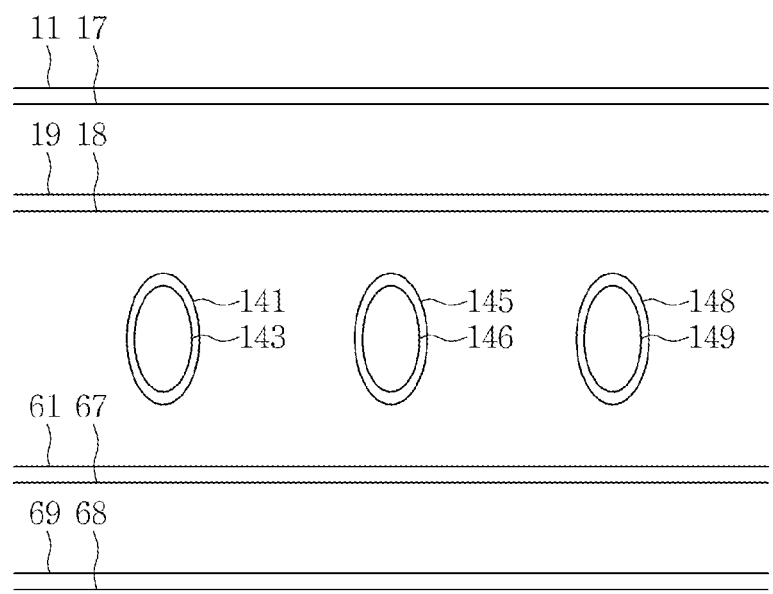

FIGS. 11 through 13 are diagrams of simulated contours of the masks of FIGS. 3, 6, and 7.

In FIGS. 11 through 13, a target layer is omitted for clarity.

FIG. 11 shows an inner contour and an outer contour of a first mask 110 shown in FIG. 3.

Referring to FIGS. 3 and 11, as shown in FIG. 11, two inner contours 114 and 16 and two outer contours 13 and 15 of a first line pattern 10 may be formed. Two inner contours 164 and 66 and outer contours 63 and 65 of a second line pattern 60 may be formed using a simulation. A line pattern shows a tendency to have a lower PV band value than a contact pattern.

Contact patterns between the line patterns 10 and 60 may be substantially problematic. Initially, because there is no pattern between contours of the contact patterns and the line pattern, bands may be neither short-circuited nor opened. Also, contours 27 and 29 of the first contact pattern 30 and contours 31 and 33 of the third contact pattern 32 are all included within optical recognition sizes (i.e., the third distance d3 and fourth distance d4). Each of E1 and E2 has been calculated in a working embodiment of this example to be about 3.8 nm.

FIGS. 12 and 13 show inner contours and outer contours of the third and second masks 130 and 120 of FIGS. 7 and 6, respectively.

Referring to FIGS. 7 and 12, inner contours 24 and 26 and outer contours 23 and 25 of the third line pattern 20 may be formed. Inner contours 54 and 56 and outer contours 53 and 55 of the fourth line pattern 50 may be formed. Because the third line pattern 20 and the fourth line pattern 50 are line patterns (1-D), PV band data may be given as a number. As a result of a calculation of values of the third mask, it can be confirmed that PV band data is 3.8 nm, and a PV band value of FIG. 12 is equal to a PV band value of FIG. 11.

Because line patterns have better process capability than contact patterns, it may be inferred that the line patterns are less sensitive to process variations than the contact patterns.

Thus, the added line patterns 20 and 50 may exhibit the same PV band value to ensure a process margin. In particular, because the added line patterns 20 and 50 have the same PV band value as the first mask 110, it can be inferred that an improved process margin may be ensured irrespective of process variations. Results of analysis of simulation data may be utilized to design a layout.

Specifically, patterns may be apportioned among a plurality of masks, process windows may be checked, and a dual pattern may be included in two of the masks based on the check of the process windows, and process windows may be checked for the mask(s) having a dual pattern. That is, the process windows are utilized, in an iteration, to correct the layout.

Referring to FIGS. 6 and 13, the inner contours 17 and 19 and the outer contours 11 and 18 of the dual first line pattern 12 may be confirmed. Also, the inner contours 67 and 69 and the outer contours 61 and 68 of the dual second line pattern 62 may be confirmed.

As a result of measurement, the second contact pattern 40, the fourth contact pattern 42, and the sixth contact pattern 44 may have relatively high PV band values. As compared with a case in which only the contact patterns of FIG. 5 are included, it may be concluded that a process margin increased. Although contours of the contact patterns of FIG. 5 are not shown, values E1 and E2 obtained using a simulation were about 5.8 nm and 6.5 nm, respectively.

However, as shown in FIG. 6, the dual first line pattern 12 and the dual second line pattern 62 are formed as spaced the distance d3 apart from the second, fourth, and sixth contact patterns 40, 42, and 44, thereby ensuring optical recognition sizes of the patterns. When the dual first line pattern 12 and the dual second line pattern 62 are formed within the distance d3 from the contact patterns 40, 42, and 44, a reduction in CD may be prevented, and the entire mask may produce patterns having a uniform CD.

When the PV band of the second mask was calculated, each of values E1 and E2 was about 3.8 nm. The second mask had the same PV band value as when the first and third masks 110 and 120 were used.

Figure 14:
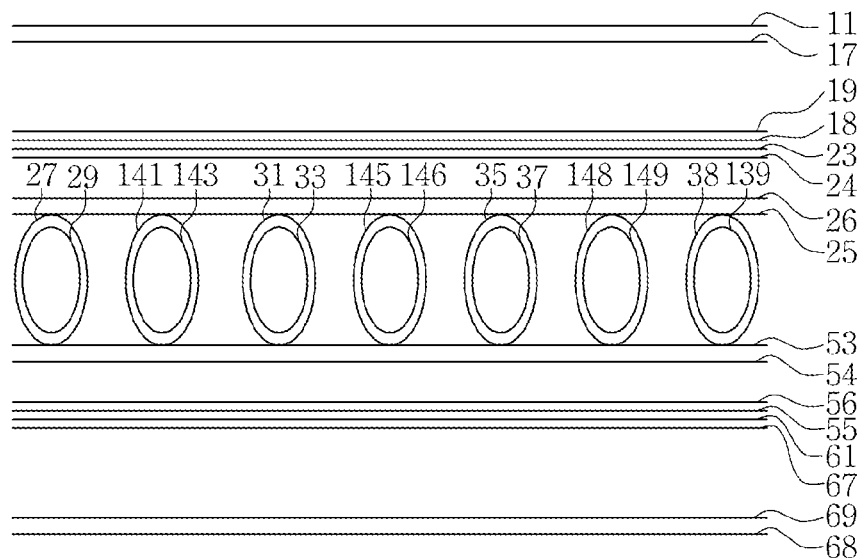
FIG. 14 shows inner contours and outer contours of three masks all together.

FIG. 14 shows inner contours and outer contours of the three masks all together.

Referring to FIG. 14, in a method of manufacturing a semiconductor device according to the inventive concept, it may be seen that a plurality of inner contours and a plurality of outer contours are neither overlapped nor opened. PV bands 11, 18, 23, and 25 neither overlap nor intersect between the first line pattern 10 and the third line patterns 30. Contours 23, 25, 27, and 29 of the third line pattern 20 and the first contact pattern 30 overlap. When a lithography process is performed with the PV bands overlapping, a bridge phenomenon may occur.

When separate lithography processes are performed using the second mask 120 and the third mask 130, as shown by the representations of FIGS. 12 and 13, PV bands may be prevented from overlapping or duplicating. That is, it may be estimated that space variations (which may be expressed as, for example, the third distance d3 and the fourth distance d4) may be maintained constant to ensure a process margin.

A method of fabricating a semiconductor device, including a process of apportioning the patterns of a mask layout into three masks, performing a lithography process using the masks, and an etching process, will now be described in detail with reference to FIGS. 15 through 24.

Figure 15:
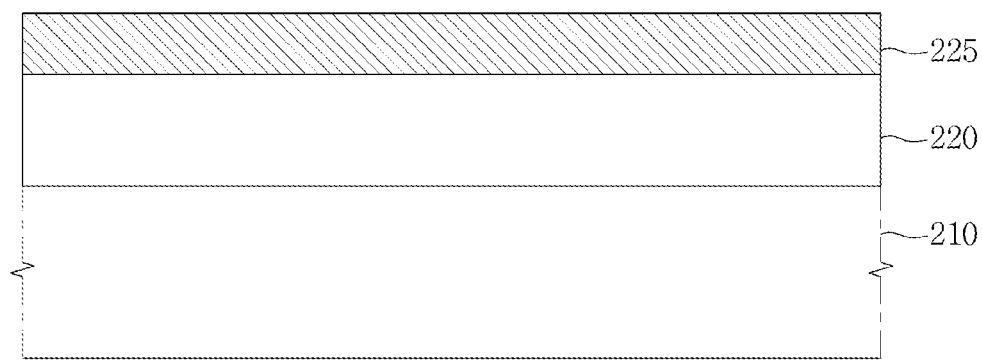
FIGS. 15, 16, 17, 18, 19, 20 21, 22, 23 and 24 are sectional views of a semiconductor device during the course of its manufacture, and collectively illustrate an embodiment of a method of fabricating the device using lithography masks, according to the inventive concept.

Referring to FIG. 15, an etch target layer 220 and a hard mask layer 225 may be sequentially formed on a substrate 210.

The substrate 210 may be a semiconductor substrate, such as a silicon wafer or a silicon on insulator (SOI) substrate. The etch target layer 220 may include a dielectric layer, a conductive layer, or a combination thereof. The hard mask layer 225 may include silicon oxide, silicon nitride, silicon oxynitride, silicon carbide, or a combination thereof.

The hard mask layer 225 may be formed using a deposition process, such as a chemical vapor deposition (CVD) process.

Figure 16:
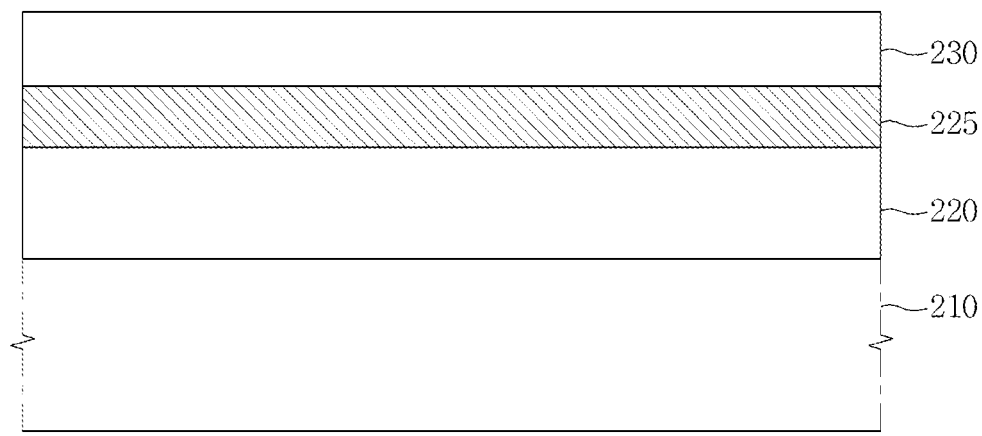

Referring to FIG. 16, a first photoresist layer 230 may be formed on the hard mask layer 225. The first photoresist layer 230 may be formed from a solution using a spin coating process.

Photoresist used for the photoresist layer may include a photosensitive organic material, for example, a photosensitive polymer or a photosensitive organic polymer. Differences in physical properties may include a difference in solubility in developing chemical (referred to as 'developing solution'). Photoresist may be classified as a positive-type photoresist or a negative-type photoresist depending on whether the exposed or non-exposed portion is soluble in the developing solution.

A soft baking process may be performed on the first photoresist layer 230.

Figure 17:
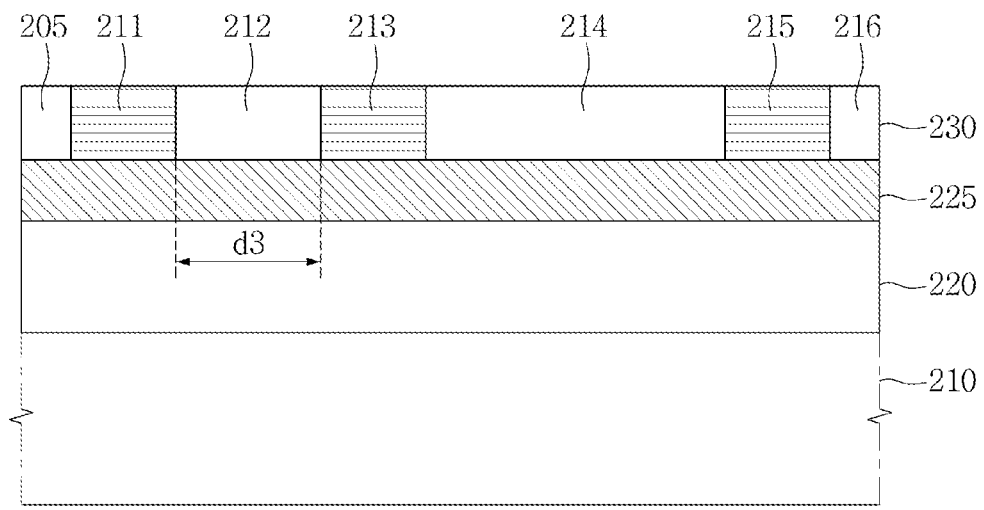

Referring to FIG. 17, the first photoresist layer 230 is exposed in a first exposure process using a first transmission mask 110T.

The light transmitted through the first transmission mask 110T along line I-II of FIG. 3 will form first, second, and third exposure regions 211, 213, and 215 in the photoresist layer 230. On the other hand, first, second, third, and fourth non-exposed regions 205, 212, 214, and 216 remain in the vicinity of the exposure regions 211, 213, and 215.

Figure 18:
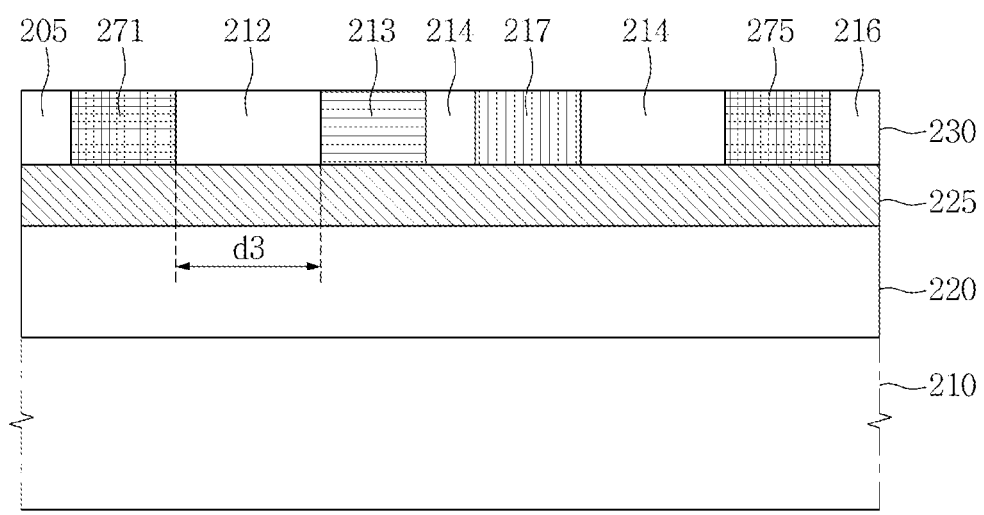

Referring to FIG. 18, a second exposure process is performed using second light transmission mask 120T. The light transmitted through the second light transmission mask 120T forms dual first, third, and fourth exposure regions 271, 275, and 217 in the previously exposed first photoresist layer 230. After the two exposure processes, twice-exposed regions (as illustrated by checks) and once-exposed regions (as illustrated by horizontal stripes or vertical stripes) exist in the photoresist layer 230. The dual first exposure region 271 and the dual third exposure region 275 are the twice-exposed regions.

Figure 19:
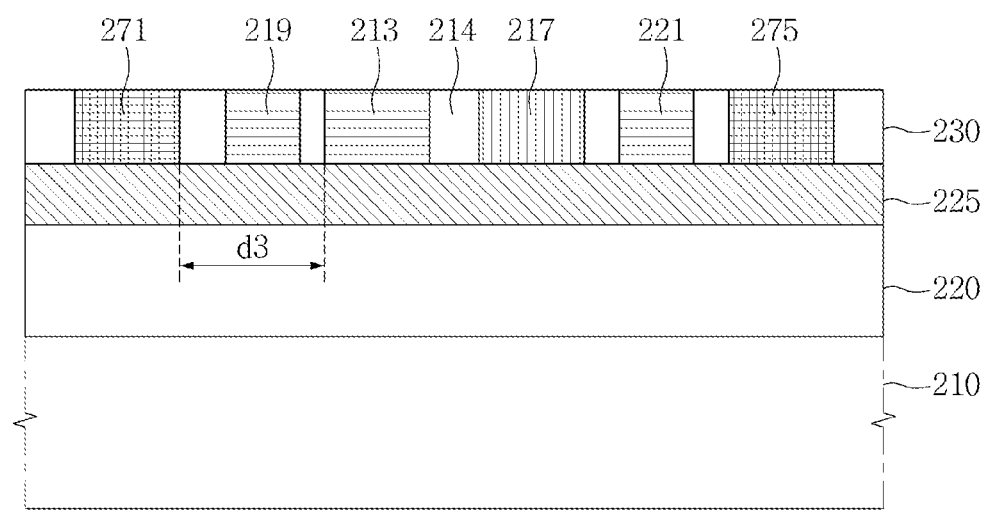

Referring to FIG. 19, a third exposure process is performed using the third light transmission mask 130T. Light transmitted through the third light transmission mask 130T forms fifth and sixth exposure regions 219 and 221 in the first photoresist layer 230 which has already been subjected to the first and second exposure processes. After the three exposure processes, the photoresist layer 230 has twice-exposed regions 271 and 275 and once-exposed regions 213, 217, 219, and 211.

Figure 20:
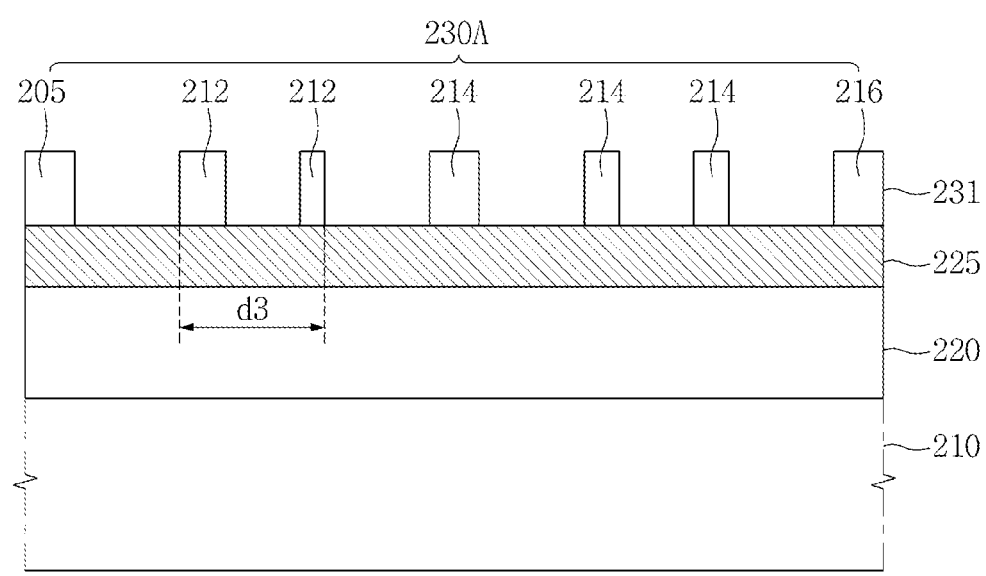

FIG. 20 shows a process of developing the photoresist layer 230 that has undergone the three exposure processes. The developing process removes the first through sixth exposure regions 261, 213, 265, 217, 219, and 221. As a result, a first mask 230A is formed. The hard mask layer 225 is partially exposed by the developing process.

Figure 21:
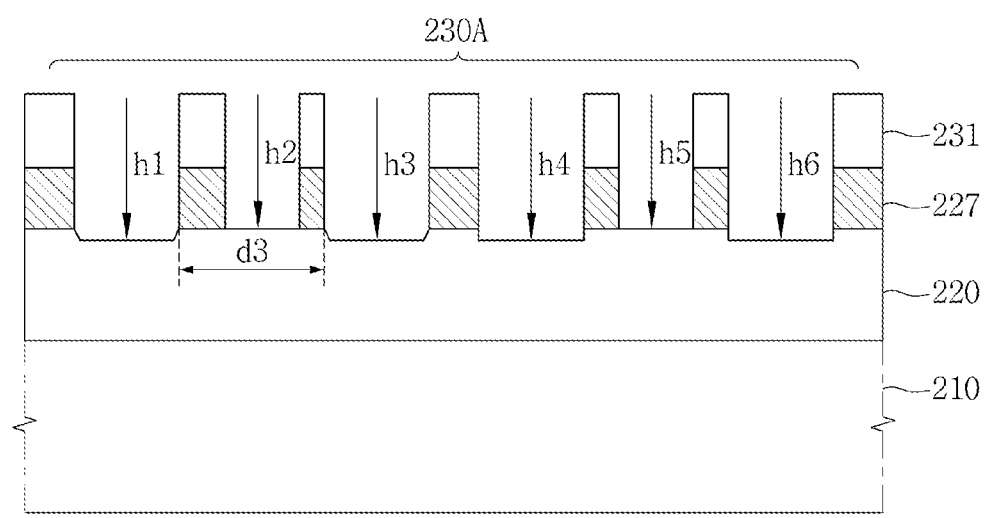

Referring to FIG. 21, an etching process is performed using the first mask 230A as an etch mask. The hard mask layer 225 may be partially removed by the etching process so that the pattern of the first mask pattern 230A is transferred to the hard mask layer 225. An anisotropic etching process is more preferable than an isotropic etching process as the etching process. A dry etching process may be used as the anisotropic etching process. An etch rate of the hard mask layer 225 may vary according to etching conditions. As a result, different etch depths h1 to h6 may be obtained. The etching of the hard mask layer 225 forms a first hard mask pattern 227.

Figure 22:
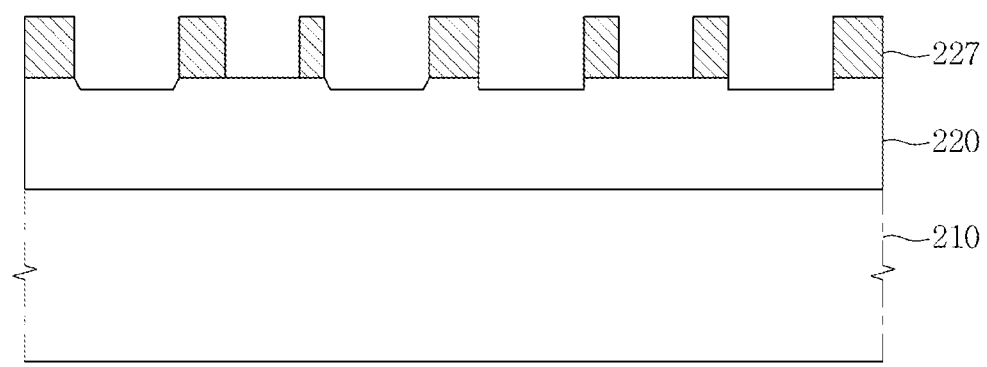

Referring to FIG. 22, the first mask pattern 230A is removed using an ashing or stripping process.

Figure 23:
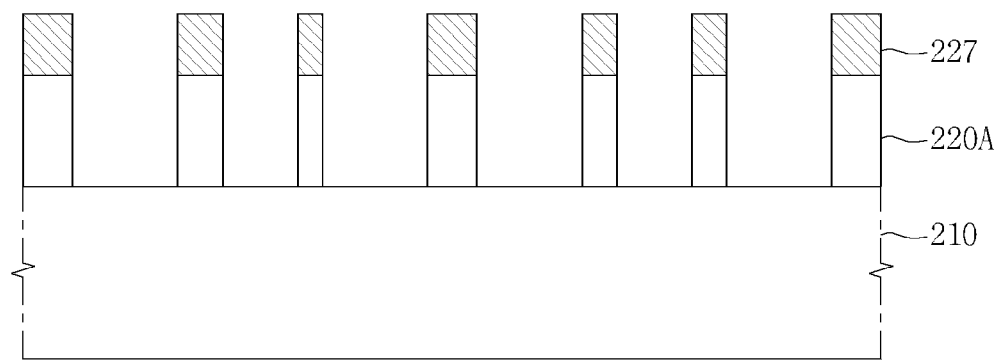

Referring to FIG. 23, the etch target layer 220 is etched using the first hard mask pattern 227 as an etch mask. Thus, a fine semiconductor pattern 220A may be formed. The fine semiconductor pattern 220A may be a gate line or bit line constituting a semiconductor device. Also, the fine semiconductor pattern 220A may be another hard mask for use in patterning a layer constituting the semiconductor device.

Figure 24:
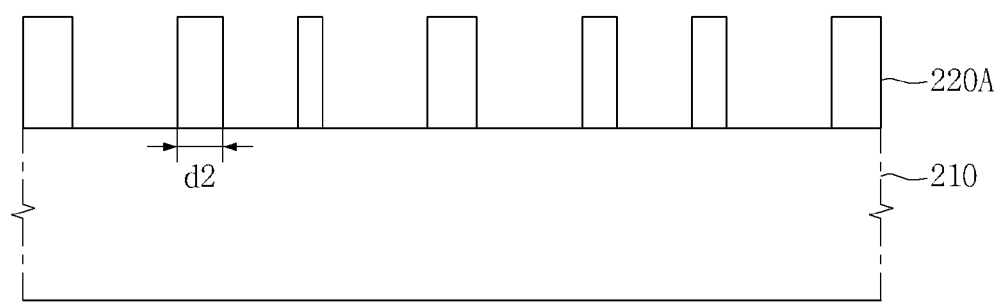

Referring to FIG. 24, the first hard mask pattern 227 may be removed using an ashing process or a stripping process.

In this way, the features or patterns of the semiconductor pattern 220A can be formed as spaced apart from one another, in a given direction(s), by distance d2 which is equal to or less than the resolution.

Hereinafter, an embodiment in which an etching process is performed three times after a lithography process will be described with reference to FIGS. 16 and 25-40.

As in the process described with reference to FIG. 16, a first photoresist layer 230 is formed on a hard mask layer 225 on a substrate 210. The first photoresist layer 230 may be a negative photoresist.

Figure 25:
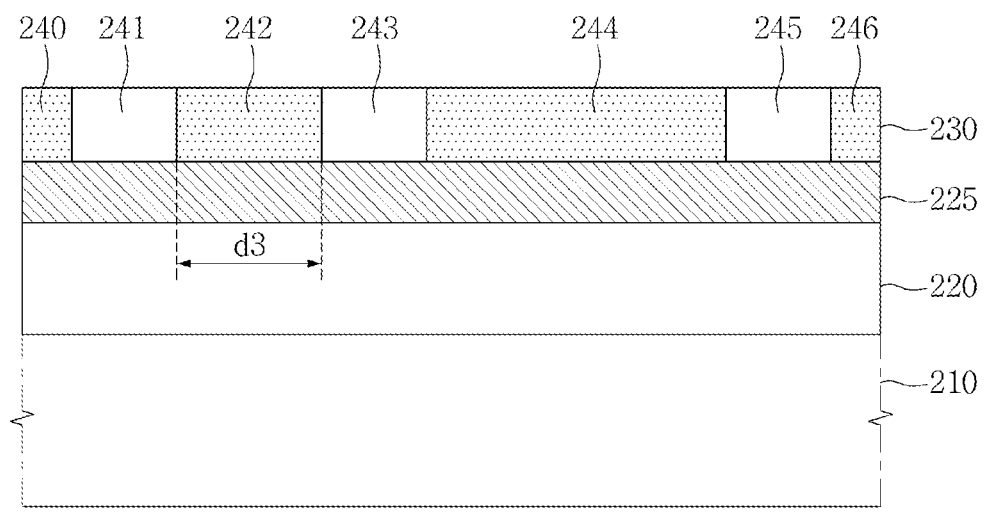
FIGS. 25, 26, 27, 28, 29, 30, 31, 32, 33, 34, 35, 36, 37, 38, 39, and 40 are sectional views of a semiconductor device during the course of its manufacture, and collectively illustrate another embodiment of a method of fabricating the device using lithography masks, according to the inventive concept.

FIG. 25 shows the results of a first exposure process using a first mask 110, along line I-II of FIG. 3.

Referring to FIGS. 3 and 25, first, second, third, and fourth exposed regions 240, 242, 244, and 246 of the photoresist layer 230 are formed and first, second, and third non-exposed regions 241, 243, and 245 remain in the photoresist layer 230 a result of the first exposure process. The width of the first non-exposed region 241 is established based on that of the second line pattern 60 of the first mask 110. The second exposed region 242 formed between the first non-exposed region 241 and the third non-exposed region 243 is that which received light transmitted through a region of the mask 110 between the second line pattern 60 and the fifth contact pattern 34. The second exposed region 242 has a width equal to the distance d3. Because the distance between the patterns is equal to or greater than the resolution, the second exposed region 242 is formed in the first photoresist layer 230 without distortions.

Figure 26:
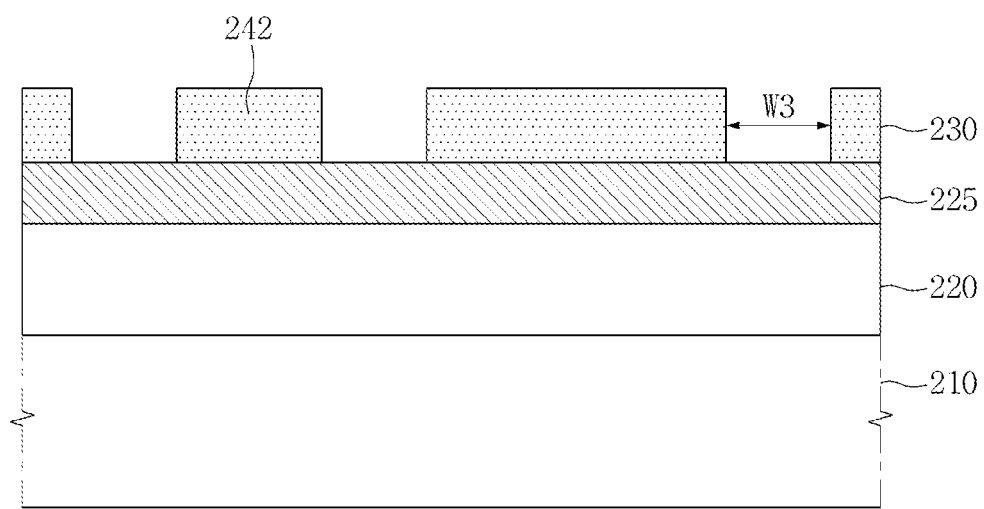

Referring to FIG. 26, the first, second, and third non-exposed regions 241, 243, and 245 are removed using a negative developing solution. As a result, the hard mask layer 225 is partially exposed, and the first, second, third, and fourth exposed regions 240, 242, 244, and 246 are retained on the hard mask layer 225. The first, second, third, and fourth exposed regions 240, 242, 244, and 246 will be referred to hereinafter as second mask patterns 240, 242, 244, and 246.

Figure 27:
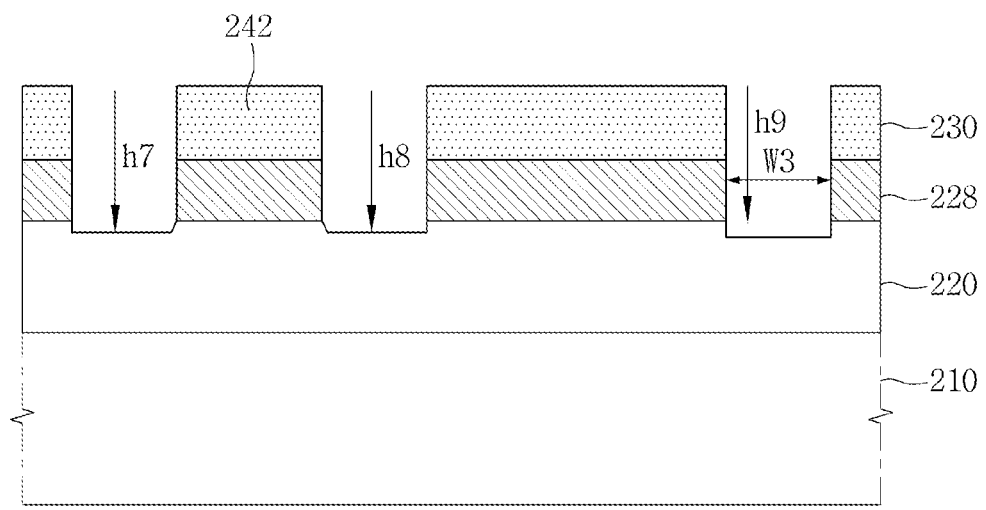

Referring to FIG. 27, the underlying hard mask layer 225 may be etched using a selective anisotropic etching process, using the second mask patterns 240, 242, 244, and 246 as an etch mask, to partially expose the etch target layer 220. Thus, a second hard mask pattern 228 having a linewidth equal to a linewidth W3 of the patterned photoresist layer 230 may be formed. In this case, the selective etching process may include a wet etching process or an isotropic etching process so that the hard mask layer 225 can have a linewidth less than the linewidth W3 of the patterned photoresist layer 230. The etching of the hard mask layer 225 forms a second hard mask pattern 228. As shown in FIG. 26, the hard mask layer 225 may be etched to different depths h7, h8, and h9. The first hard mask pattern 228 may be etched under the removed first non-exposed region 241, the second non-exposed region 243, and the third non-exposed region 245.

Figure 28:
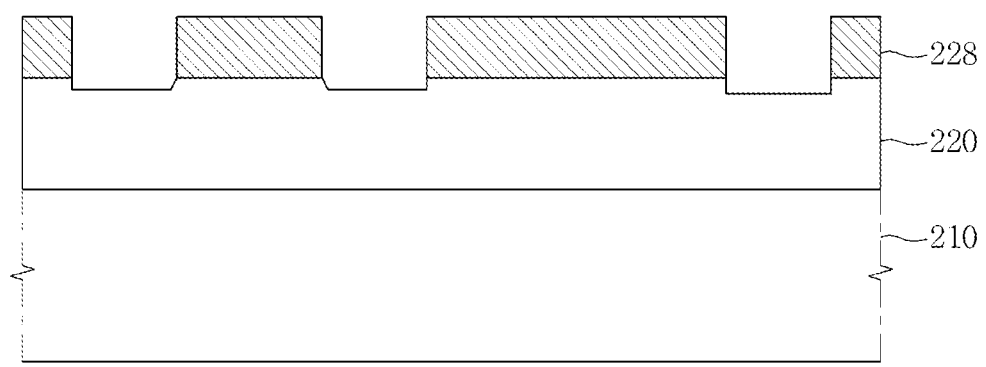

Referring to FIG. 28, the second mask patterns 240, 242, 244, and 246 may be removed using an ashing or stripping process.

Figure 29:
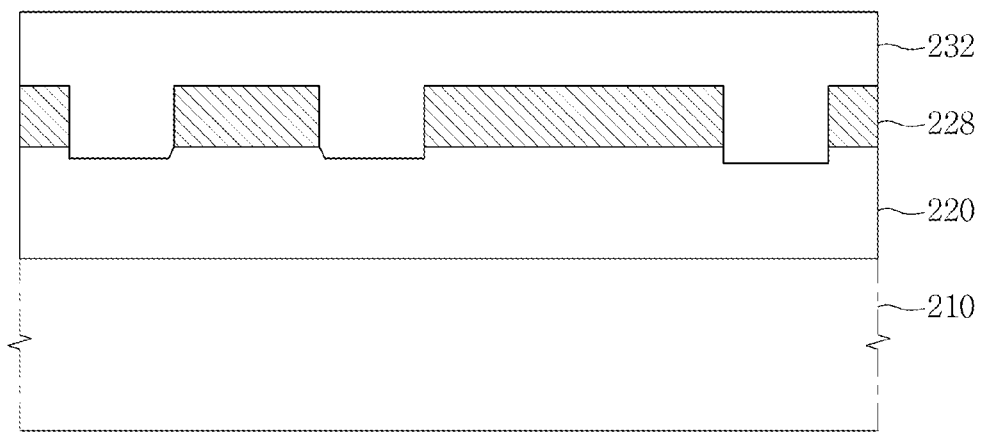

Referring to FIG. 29 a second photoresist layer 232 is formed on the etch target layer and the second hard mask pattern.

Figure 30:
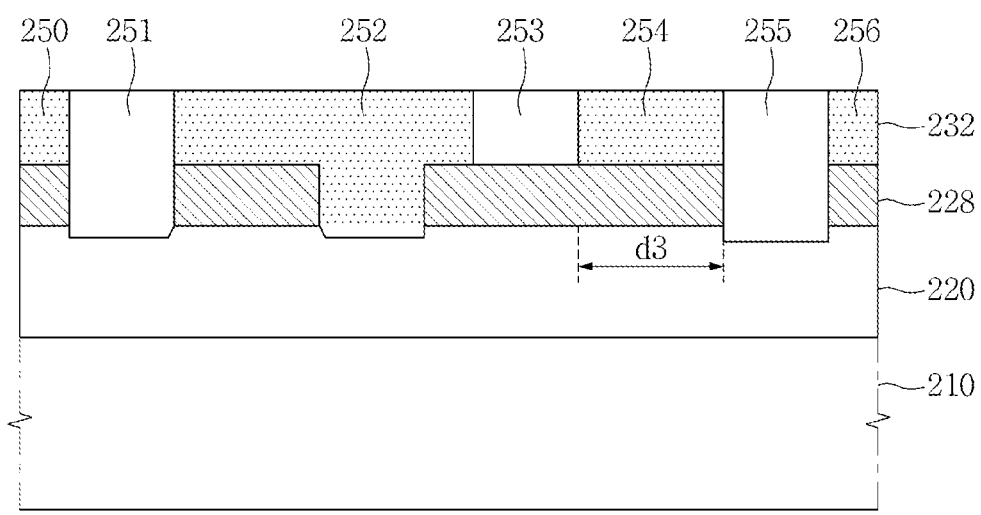

Referring to FIG. 30, after the second photoresist layer 232 is formed, a second exposure process is performed using second mask 120. The second exposure process may be referred to as a dual exposure process because the second mask 120 has dual patterns 12 and 62. The results shown are those from exposure light incident on the second mask 120 along line I-II of FIG. 6.

Specifically, as a result of the second exposure process, the second photoresist layer 232 has fifth, sixth, seventh, and eighth exposed regions 250, 252, 254, and 256 and fourth, fifth, and sixth non-exposed regions 251, 253, and 255. The width of the fourth non-exposed region 251 is established by that of the dual second line pattern 62 of the second mask 110. The sixth exposed region 252 formed between the fourth non-exposed region 251 and the fifth non-exposed region 253 may have a greater width than during the first exposure process and the etching process. The fifth non-exposed region 253 is a region corresponding to the sixth contact pattern 44 of the second mask 120 and a region that does not transmit light. The seventh photoresist region 254 formed between the fifth non-photoresist region 253 and the sixth non-photoresist region 255 corresponds to a region of the second mask 120 that transmits light between the sixth contact pattern 44 and the dual first line pattern 12. The seventh photoresist region 254 has a width equal to the distance d3.

Figure 31:
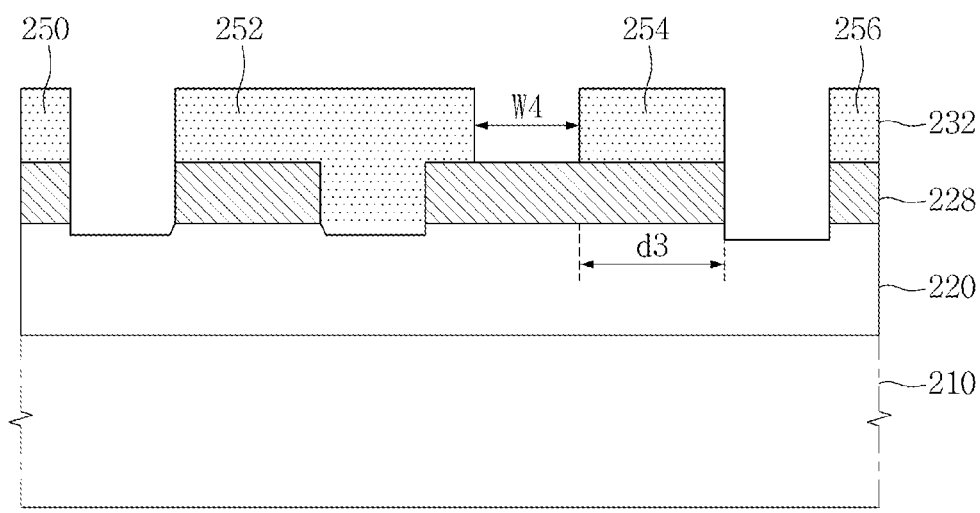

Referring to FIG. 31, the fourth, fifth, and sixth non-exposed regions 251, 253, and 255 are removed using a negative developing solution. As a result, the second hard mask pattern 228 is partially exposed. The etch target layer 220 on which the first exposure process and an etching process have been performed may also be partially exposed. The fifth, sixth, seventh, and eighth photoresist regions 250, 252, 254, and 256 may be retained on the second hard mask pattern 228. The fifth, sixth, seventh, and eighth photoresist regions 250, 252, 254, and 256 may be referred to as third mask patterns 250, 252, 254, and 256.

Figure 32:
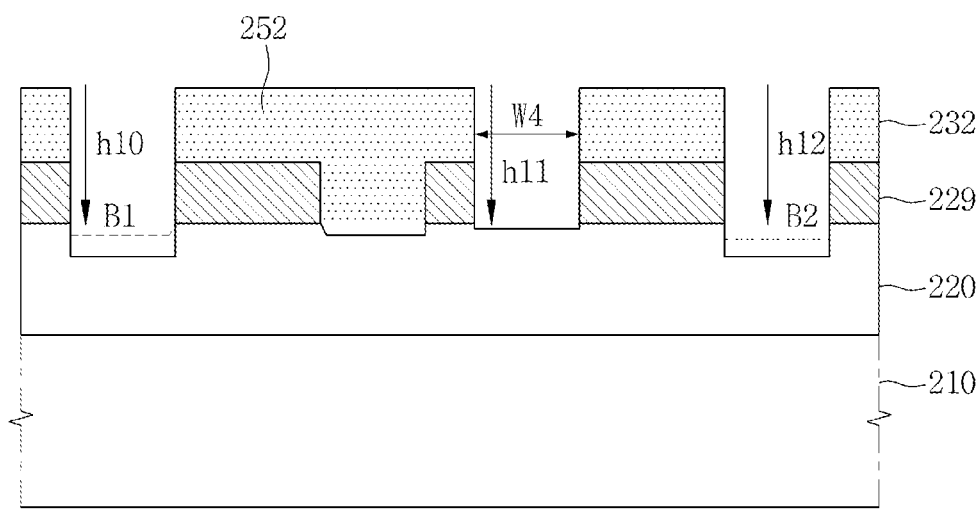

Referring to FIG. 32, the second hard mask pattern 228 is etched to partially expose the etch target layer 220.

In this example, the underlying second hard mask 228 is patterned using a selective anisotropic etching process using the third mask patterns 250, 252, 254, and 256 as an etch mask. Thus, a third hard mask pattern 229 having a linewidth equal to a linewidth W4 of the second photoresist layer 232 may be formed. The selective etching process may include a wet etching process or an isotropic etching process so that the second hard mask pattern 228 can have a linewidth smaller than the linewidth W4 of the second photoresist layer 232. The etching of the second hard mask pattern 228 may form a third hard mask pattern 229. As shown in FIG. 32, the second hard mask pattern 228 may be etched to different depths h10, h11, and h12.

In this process as described above, the second hard mask pattern 228 is etched in the regions previously occupied by the fourth non-photoresist region 251, the fifth non-photoresist region 253, and the sixth non-photoresist region 255. Overetching may occur at regions B1 and B2 previously occupied by the fourth non-photoresist region 251 and the sixth non-photoresist region 255 because two etching processes (an etching process performed after the first exposure process and an etching process performed after the second exposure process) are performed at these regions. Overetching reduces the thickness of the etch target layer 220. Note, these regions B1 and B2 at which the thickness of the etch target layer 220 is reduced correspond to the dual patterns 12 and 62. An etch loading effect may be reduced due to the overetching so that an etch skew can be maintained constant.

Figure 33:
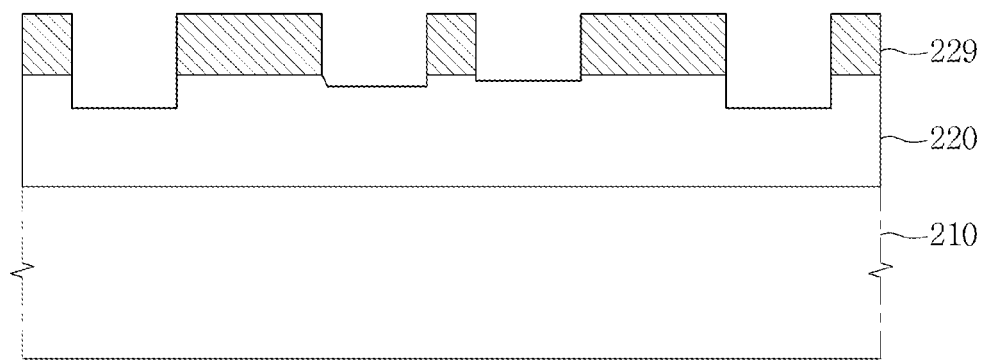

Referring to FIG. 33, the second photoresist layer 232 may be removed using an ashing or stripping process.

Figure 34:
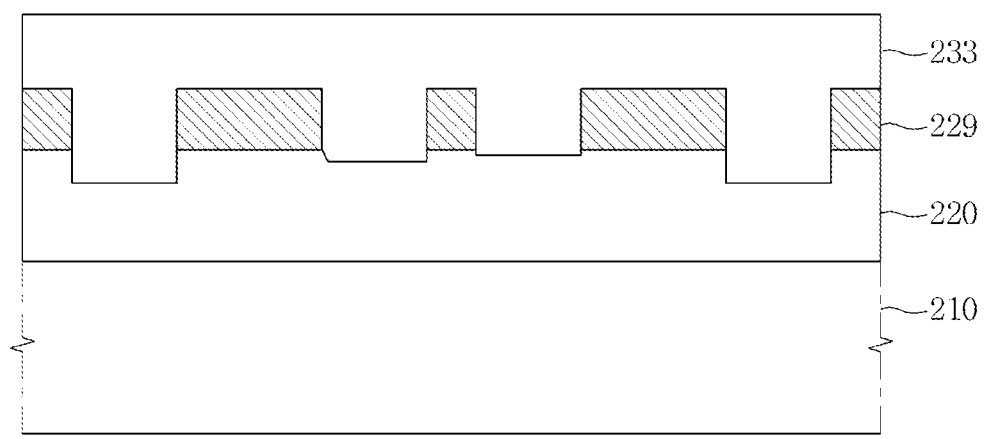
Figure 35:
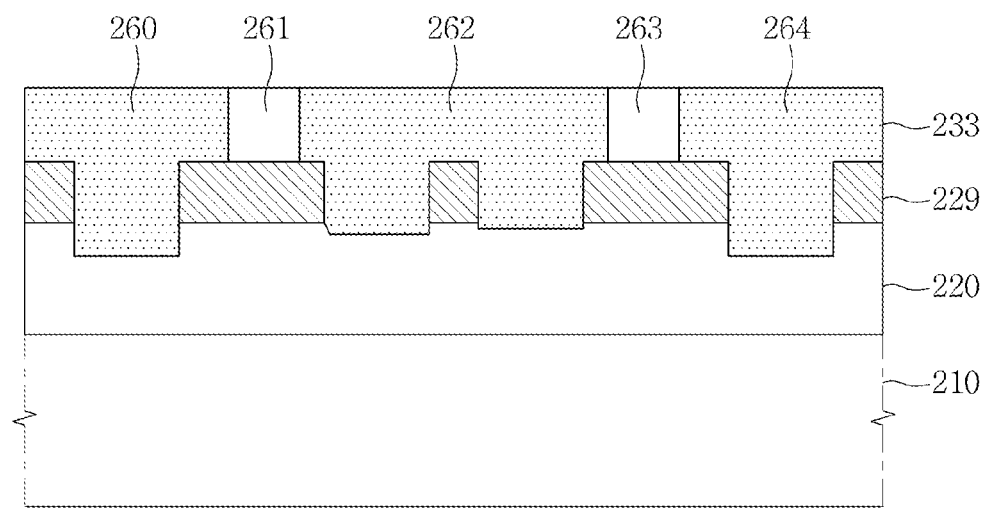

Referring to FIG. 34, a third photoresist layer 233 is formed on the semiconductor layer Referring to FIG. 7 and FIG. 35, the third photoresist layer 233 is exposed (third exposure process) using third mask 130. The results shown are for those of the exposure light incident on the third mask 130 along line I-II of FIG. 7.

As a result, ninth, tenth, and eleventh exposed regions 260, 262, and 264 are formed and seventh and eighth non-exposed regions 261 and 263 remain in the photoresist layer 233. The width of the seventh non-exposed region 261 is established by that of the fourth line pattern 50 of the third mask 130. The width of the eighth non-exposed region 263 is established by that of the third line pattern 20 of the third mask 130.

Figure 36:
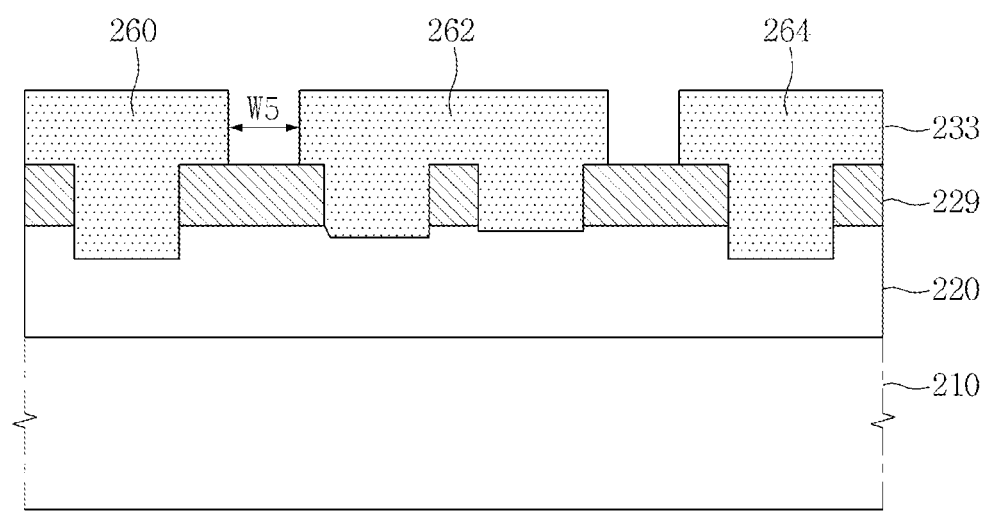

Referring to FIG. 36, the seventh and eighth non-exposed regions 261 and 263 are removed using a negative developing solution. As a result, the third hard mask pattern 229 may be partially exposed.

The ninth, tenth, and eleventh exposed regions 260, 262, and 264 are retained in the third hard mask pattern 229. The ninth, tenth, and eleventh photoresist regions 260, 262, and 264 may be referred to as fourth mask patterns 260, 262, and 264, respectively.

Figure 37:
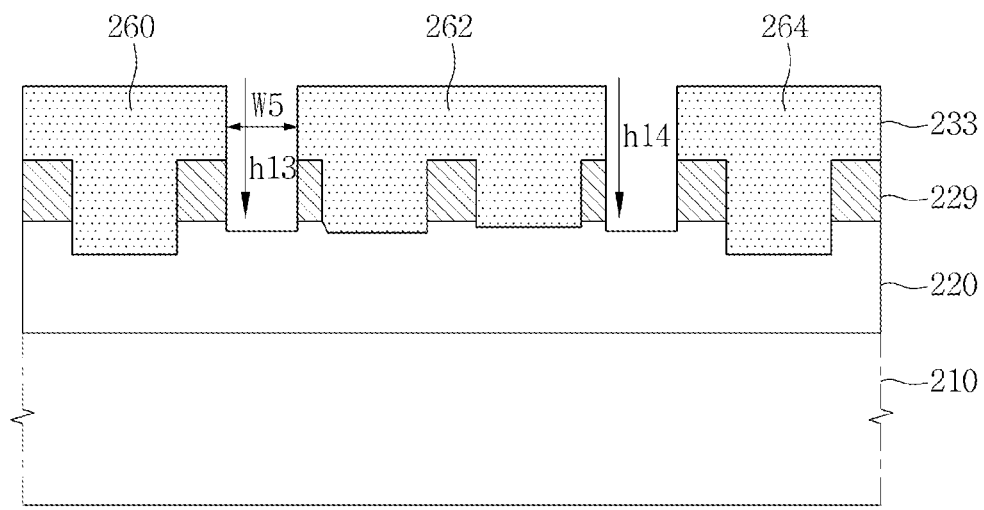

Referring to FIG. 37, the third hard mask pattern 229 is etched to partially expose the etch target layer 220.

In this example, the underlying third hard mask pattern 229 is patterned using a selective anisotropic etching process using the third mask patterns 260, 262, and 264 as an etch mask. Thus, a fourth hard mask pattern 224 having a linewidth equal to a linewidth W5 of the third photoresist layer 233 may be formed. In this case, the selective etching process may include a wet etching process or an isotropic etching process so that the third hard mask pattern 229 can have a linewidth smaller than the linewidth W5 of the third hard mask pattern 229. After the etching of the third hard mask pattern 229 forms a fourth hard mask pattern 224, the third photoresist layer 233 formed on the third hard mask pattern 229 may be removed. As shown in FIG. 34, the third hard mask pattern 229 may be etched to different depths h13 and h14.

Figure 38:
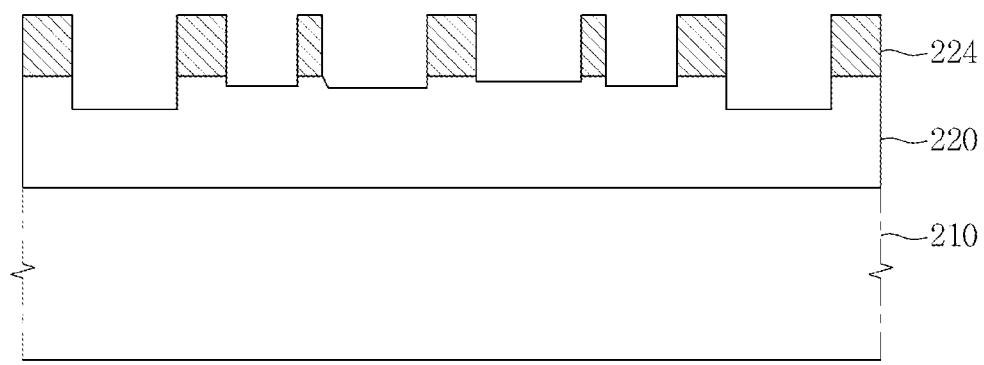

Referring to FIG. 38, the third photoresist layer may be removed using an ashing process or a stripping process.

Figure 39:
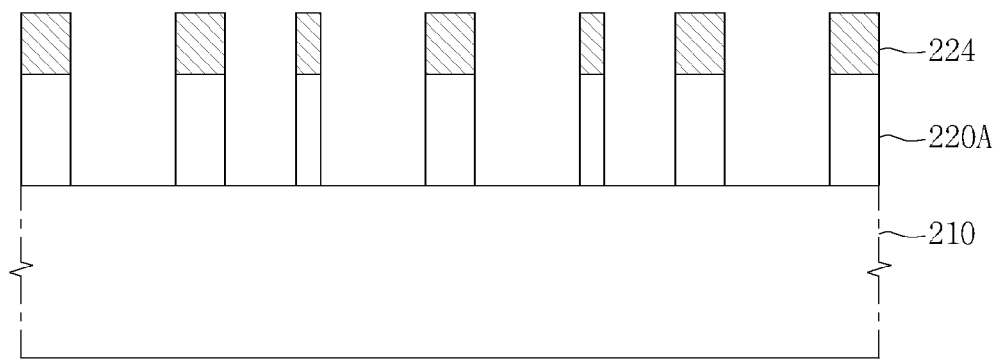

Referring to FIG. 39, the etch target layer 220 is etched using the fourth hard mask pattern 224 as an etch mask. The etching the etch target layer 220 may expose a top surface of the substrate 210. The etch target layer 220 may be a fine semiconductor pattern 220A, i.e., a pattern whose features have very small widths and/or a very small pitch.

Figure 40:
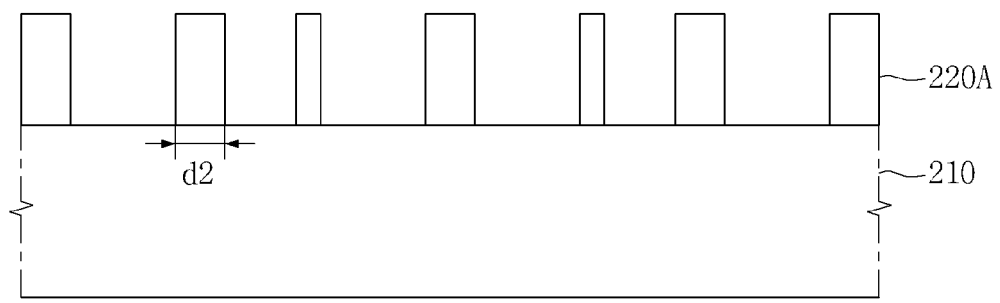

Referring to FIG. 40, the fourth hard mask pattern 224 may be removed. Thus, FIG. 40 shows the fine semiconductor pattern 220A formed using masks fabricated according to the inventive concept. It can be confirmed that a CD of the semiconductor pattern 220A may correspond to the second distance d2 between the second line pattern 60 and the fourth line pattern 50 of the original mask layout 100, i.e., a distance less than the resolution of the lithography equipment.

According to another aspect of the inventive concept, when a dual pattern is provided in each of the masks 110, 120, and 130, an etch skew may be affected. The etch skew is a difference between an after-development inspection (ADI) CD and an after-cleaning inspection (ACI) CD. The ADI CD is a critical value obtained after a developing process is performed using photolithography, while the ACI CD is a critical value obtained after an etching process is ended.

Comparisons between an isolated pattern and a dense pattern, which have the same DOF margin, will be described.

In the case of the DOF margin of the dense pattern, a final inspection (FI) margin may have a constant bias in a focus margin. In contrast, in the case of the DOF margin of the isolated pattern, since an FI margin has a variable etch bias toward an edge in the DOF, it may be difficult to control the etch bias. When resolution conditions and process conditions are satisfied using a dual pattern as in the inventive concept, the pattern density is increased so that the isolated pattern disappears, the etch bias can be easily controlled, and an etch skew can be maintained constant.

FIGS. 41 through 47 shows a process of checking resolution conditions and process conditions and apportioning patterns into three mask layouts in an embodiment of a method of manufacturing a semiconductor device according to the inventive concept resolution.

Figure 41:
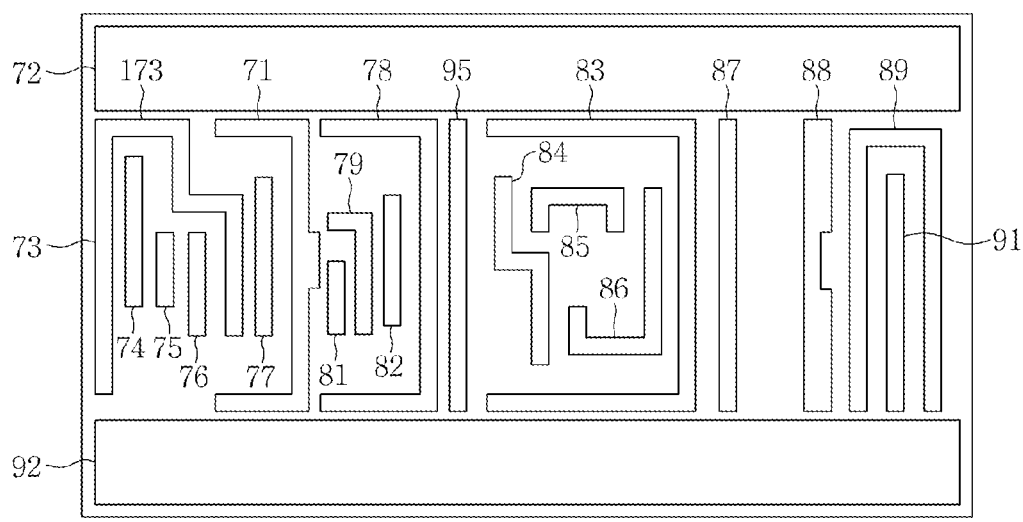
FIGS. 41, 42, 43, 44, 45, 46 and 47 are mask layout diagrams, including plan views of final masks fabricated, in a method according to the inventive concept.

FIG. 41 shows a cell layout 200 of patterns for use in manufacturing a semiconductor device (operation S06). The patterns include first and second line patterns 72 and 92, and patterns 71, 73-79, 81-89, 91 and 95. Some of the patterns, like pattern 73, has one or more bends. Others of the patterns, like line pattern 87 divides the layout into respective cells.

In any case, the patterns are apportioned among masks as described with FIGS. 3 through 7.

Briefly, the space(s) between adjacent patterns is/are determined (operation S10).

Figure 42:
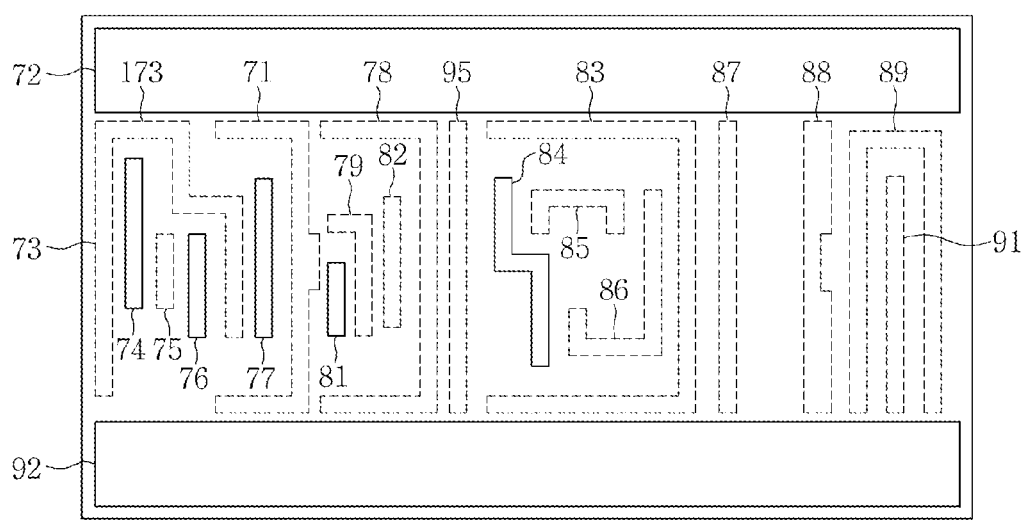

A first mask 140, as shown in FIG. 42, is formed according to the method. Referring to FIGS. 1 and 42, line pattern 72 is selected from cell layout 200 for inclusion in the first mask 72. A first pattern 73 of a cell, and which has four bends, does not satisfy resolution conditions with the line pattern 72 because of a first portion 173 of first pattern 73 (operation S21). Accordingly, the first pattern 73 is omitted from the first mask 140.

Line patterns 74, 75, and 76 are also provided in the cell of the cell layout 200. The line patterns 74, 75, and 76 have a smaller length than the line pattern 72 in this example.

The distance between the line pattern 74 and the line pattern 72 satisfies resolution conditions. Thus, the line pattern 74 is included in the fourth mask 140.

The distance between the line pattern 76 and each of the line patterns 72 and 74 satisfies resolution conditions. Therefore, the line pattern 76 is also included in the first mask 140. Other patterns of the cell layout 200 are selected for inclusion in the first mask 140 in the same manner as described above. These patterns are illustrated with solid lines in FIG. 42. An inspection of the first mask 140 (operation S31) will be described later.

Figure 43:
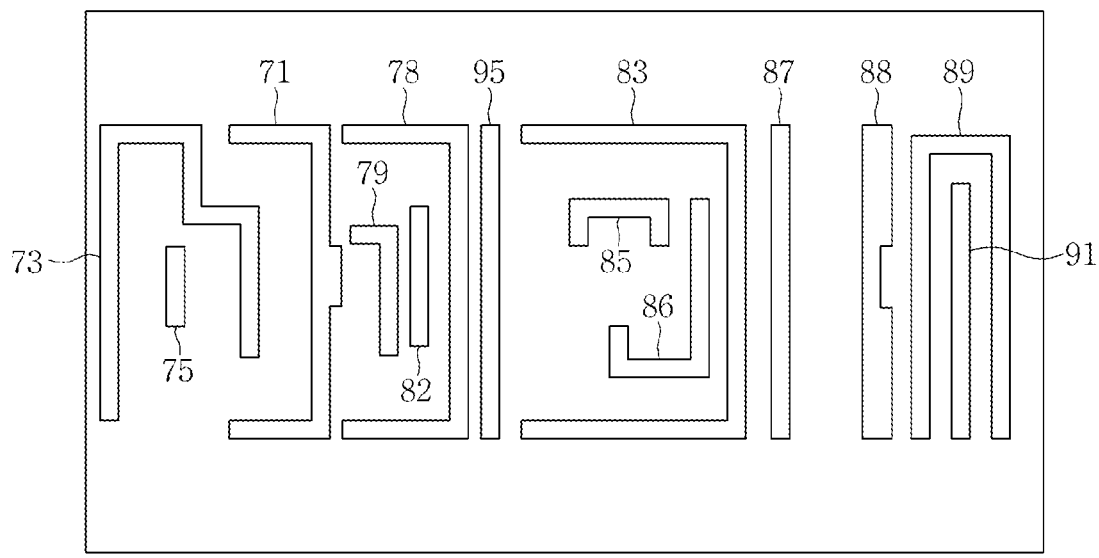

FIG. 43 shows the patterns of the cell layout 200 omitted from the first mask 140.

This cell layout of patterns will be referred to as a preliminary second mask 150A. A process of selecting the patterns of the preliminary fifth mask 150A, which do not satisfy resolution conditions, is performed in the same manner as described with reference to FIGS. 3 through 7.

Figure 44:
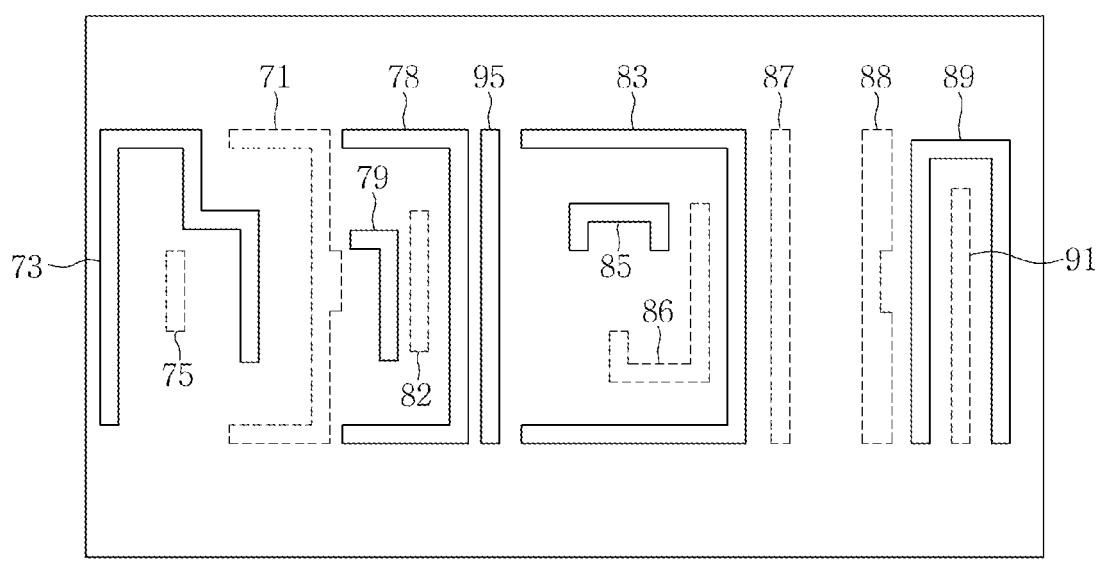

These patterns are omitted from a second (finalized) mask 150 (FIG. 44).

For example, referring to FIG. 44, in the preliminary second mask 150A, a distance between the line pattern 75 and the pattern 73 is equal to or less than the resolution. Therefore, the line pattern 75 is omitted from the second mask 150. Other patterns of the preliminary second mask 150A which do not satisfy the resolution conditions are also omitted from the fifth mask 150, in the above-described manner.

Figure 45:
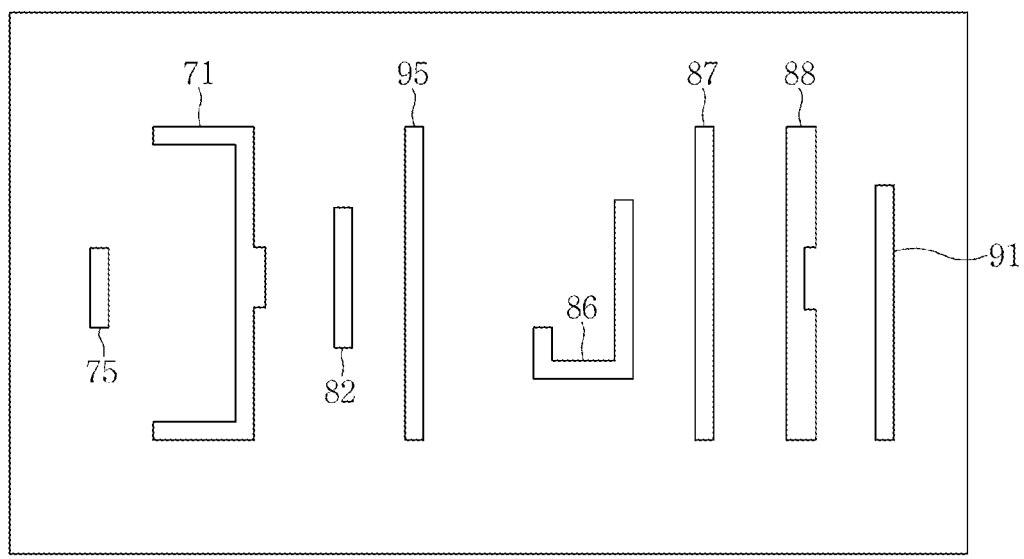

FIG. 45 shows those patterns not included in the second mask 150 and which are thus apportioned to a third mask 160.

Referring to FIG. 45, ninth line pattern 75, the second pattern 71, and line pattern 82 satisfy the resolution conditions. Accordingly, it may be decided that these patterns are to be included in the third mask 160. It may be concluded that a space between the patterns included in the third mask 160 is within a distance affected by an optical proximity effect. Accordingly, it may be decided that the third mask 160 satisfies the resolution conditions and process conditions. Hereinafter, a process of inspecting the first mask 140 to determine whether process conditions are satisfied will be described.

Figure 46:
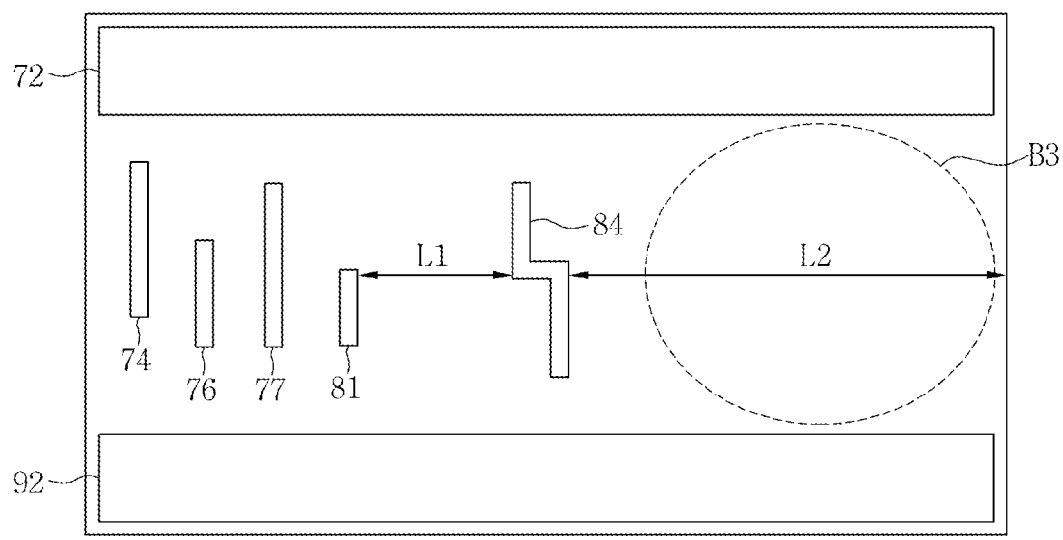

Referring to FIGS. 1 and 46, a space between the line pattern 81 and the line pattern 84 having a bend is denoted by L1. However, no pattern exists to the side of the line pattern 84 opposite that of the line pattern 81 (the right side in the figure). Therefore, there is no pattern within a distance affected by the optical proximity effect. That is, it is determined that an isolated pattern region B3 is present on the right side of the line pattern 84 (operation S31). When an isolation pattern region B3 is present, a determination is made as to whether a pattern, included in other ones of the masks, may be added as a dual pattern (operation S40).

However, the patterns in the other masks may not satisfy resolution conditions with the first line pattern 72 or the second line pattern 92.

Figure 47:
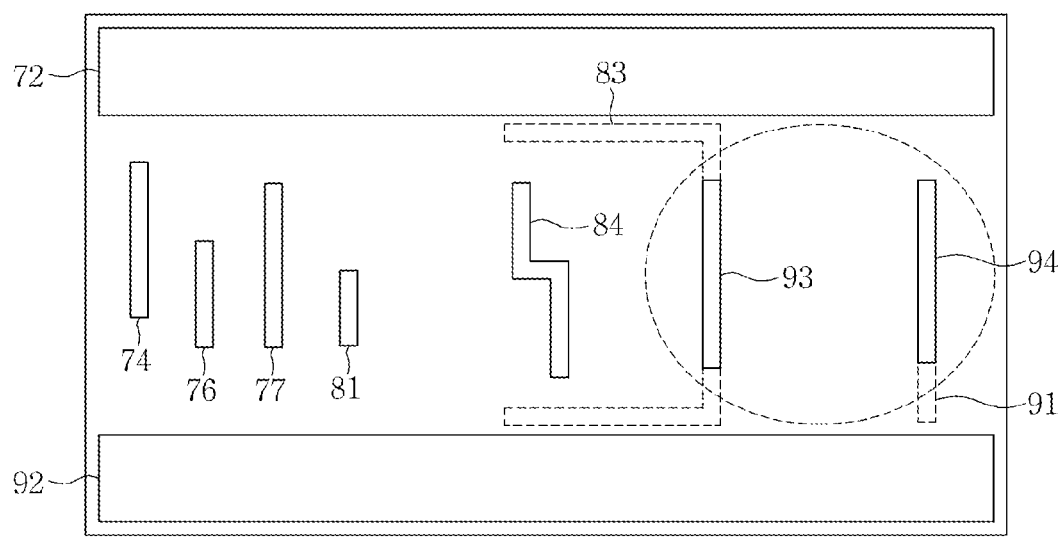

A ⊐-shaped line pattern 83 of the second mask 150 and a line pattern 91 within a Π-shaped line pattern 89 of the third mask 160 may be considered as patterns that may be added as a dual pattern. However, each of the ⊐-shaped line pattern 83 and the line pattern 91 surrounded with the Π-shaped line pattern 89 is spaced a short distance from the line pattern 92. Therefore, they do not satisfy the resolution conditions in this example (operation S50). In this case, the patterns 83 and 91 may be cut (operation S51), i.e., portions only of the patterns 83 and 91 are included in the mask 140 as dual patterns, as shown in FIG. 47.

In this operation, it is determined that an end portion (illustrated with a dotted line) of the line pattern 91 within the Π-shaped line pattern 89 does not satisfy the resolution conditions. Therefore, the end portion of the line pattern 91 is omitted and the remaining portion of the line pattern 91 is included in the first mask 140 as a dual pattern (operation S51). The same process is shown with a dotted line for pattern 93.

As a result, the patterns of the first mask 140 satisfy both resolution conditions and process conditions. Accordingly, a process margin in the lithography process is improved.

As described above, according to an aspect of the inventive concept, a dual pattern may be added in consideration of the resolution of the lithography equipment and variations in spaces between adjacent patterns in an original mask layout, e.g., an original cell layout. By adding the dual pattern, process capability in a photolithography process may be improved, and an etch skew in an etching process may be maintained constant.

Figure 48:
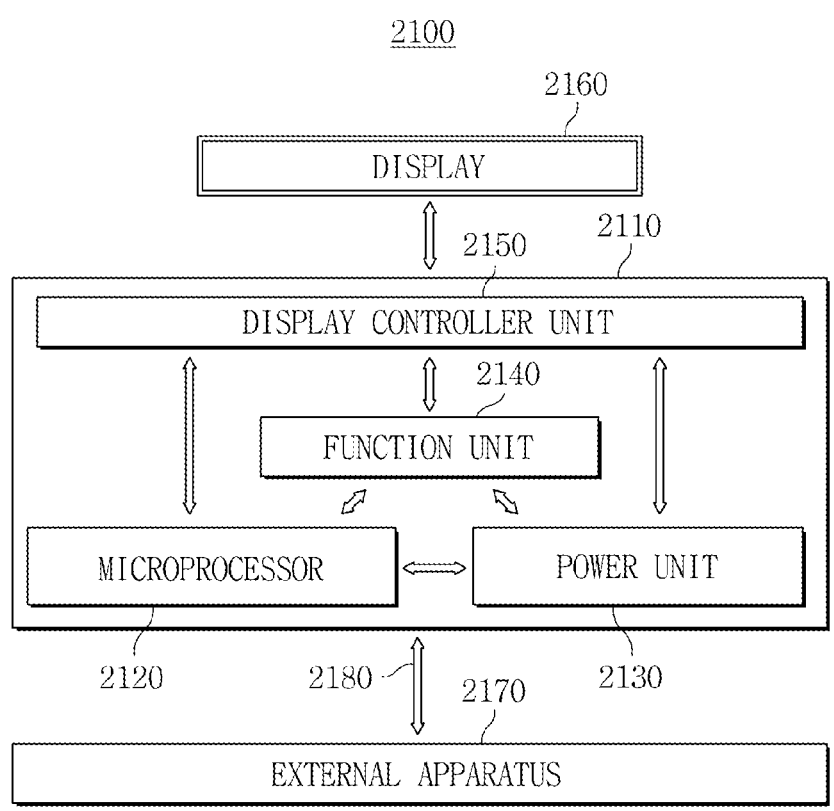
FIG. 48 is a block diagram of an electronic system manufactured according to the inventive concept.

FIG. 48 is a block diagram of an electronic system 2100 that may be fabricated using a method according to the inventive concept.

Referring to FIG. 48, a semiconductor device fabricated by a method according to the inventive concept may be employed by an electronic system 2100. The electronic system 2100 may include a body 2110, a microprocessor (MP) 2120, a power unit 2130, a function unit 2140, and/or a display controller unit 2150. The body 2110 may be a mother board having a printed circuit board (PCB). The MP 2120, the power unit 2130, the function unit 2140, and the display controller unit 2150 may be mounted on the body 2110. A display 2160 may be disposed on a top surface of the body 2110 or outside the body 2110. For example, the display 2160 may be disposed on a surface of the body 2110 and display an image processed by the display controller unit 2150.

The power unit 2130 may receive a predetermined voltage from an external power source, divide the predetermined voltage into various voltage levels, and transmit apportioned voltages to the MP 2120, the function unit 2140, and the display controller unit 2150. The MP 2120 may receive a voltage from the power unit 2130 and control the function unit 2140 and the display 2160. The function unit 2140 may implement various functions of the electronic system 2100. For instance, when the electronic system 2100 is a smart phone, the function unit 2140 may include several elements capable of wireless communication functions, such as output of an image to the display 2160 or output of a voice to a speaker, by dialing or communication with an external device 2170. When the function unit 2140 includes a camera, the function unit 2140 may serve as an image processor.

When the electronic system 2100 is connected to a memory card to increase capacity, the function unit 2140 may be a memory card controller. The function unit 2140 may exchange signals with the external device 2170 through a wired or wireless communication unit 2180. In addition, when the electronic system 2100 needs a universal serial bus (USB) to expand functions thereof, the function unit 2140 may serve as an interface controller. The function unit 2140 may include a mass storage device.

A semiconductor device fabricated according to the inventive concept may be employed by the function unit 2140 or the MP 2120.

According to the inventive concept as described above, there is provided a method which can effectively apportion the patterns of a mask layout among a plurality of masks for use in a multi-patterning process, so that a lithography process is improved in terms of its DOF and resolution. Also, critical dimension (CD) uniformity can be improved during an exposure process, and an etch loading effect can be reduced during an etching process to form fine semiconductor patterns.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A method of manufacturing a semiconductor device, comprising:
   using a computer program to generate an original layout of patterns wherein adjacent ones of the patterns are spaced from each other by a distance equal to or less than a resolution of a lithography process;
   fabricating a plurality of lithography masks, including by:
   apportioning the patterns of the original layout among the lithography masks in such a way that the lithography masks have mask patterns derived from the original layout, and in each of the lithography masks each one of the mask patterns is spaced from the mask pattern closest thereto by a distance greater than the resolution,
   checking the layout of the patterns apportioned to each of the lithography masks to ascertain whether each of the patterns and the pattern closest thereto in the layout are spaced a distance equal to at least twice the resolution, and
   incorporating, into one of the lithography masks, a dual pattern in a region between respective ones of the patterns determined by said checking to be spaced a distance equal to at least twice the resolution,
   the dual pattern corresponding to at least part of one of said mask patterns of another of the lithography masks; and
   forming a semiconductor pattern on a substrate using all of the lithography masks including that having the dual pattern.

2. The method of claim 1, wherein the fabricating of the lithography masks comprises fabricating a first mask having first patterns and a second mask having second patterns that do not overlap the first patterns in a plan view in which the first and second masks are stacked as vertically aligned,
   said checking comprises checking whether a distance from one of the first patterns before arriving at any other of the first patterns is less than a predetermined value equal to twice the resolution, and
   said incorporating comprises incorporating a copy of at least part of one of the first patterns into the second mask as the dual pattern.

3. The method of claim 2, wherein the dual pattern has the same size and shape as said one of the first patterns.

4. The method of claim 2, wherein the dual pattern has the size and shape of only a portion of said one of the first patterns.

5. The method of claim 2, wherein a distance between the dual pattern and one of the second patterns closest to the dual pattern in the second mask is substantially equal to a distance between said one of the first patterns and another one of the first patterns closest to said one of the first patterns in the first mask.

6. The method of claim 2, wherein the dual pattern corresponds to separated portions of said one of the first patterns.

7. The method of claim 2, wherein the first mask has a first pattern density, the second mask including the dual pattern has a second pattern density, the first pattern density corresponds to a ratio of a first area within which the first mask patterns are all located to the total surface area of the first mask patterns within said first area, the second pattern density corresponds to a ratio of a second area within which the second mask patterns are all located to the total surface area of the second mask patterns within said second area, and the first pattern density is substantially equal to the second pattern density.

8. The method of claim 2, further comprising:
   wherein said checking comprises checking a process window of each of layouts of the patterns of the first and second masks with and without the dual pattern included in the second mask.

9. The method of claim 8, wherein the process window includes dose and defocus information of the lithography process.

10. The method of claim 8, wherein the process window includes process variability (PV) band data.

11. The method of claim 10, wherein the PV band data includes information regarding a distance between a target layer and each of an inner contour and an outer contour, the information obtained as a result of computer simulations.

12. The method of claim 2, wherein the forming of the semiconductor pattern on the substrate comprises:
    sequentially forming an etch target layer, a hard mask layer, and a photoresist layer on the substrate;
    exposing the photoresist layer using the first mask;
    exposing the photoresist layer using the second mask including the dual pattern;
    forming a first hard mask pattern using the exposed photoresist layer;
    removing the exposed photoresist layer; and
    patterning the etch target layer using the first hard mask pattern.

13. The method of claim 2, wherein the forming of the semiconductor pattern on the substrate comprises:
    sequentially forming an etch target layer, a hard mask layer, and a first photoresist layer on the substrate;
    exposing the first photoresist layer using the first mask;
    forming a second hard mask pattern using the exposed first photoresist layer;
    removing the first photoresist layer;
    forming a second photoresist layer;
    exposing the second photoresist layer using the second mask;
    forming a third hard mask pattern using the exposed second photoresist layer;
    removing the second photoresist layer; and
    patterning the etch target layer using the second hard mask pattern.

14. A method of fabricating a set of lithography masks for use in a lithography process, the method comprising:
    producing an original mask layout including patterns between which a space is equal to or less than a resolution of the lithography process;
    separating the patterns into first respective and second respective ones of the patterns based on whether distances between adjacent ones of the patterns are each greater than the resolution;
    fabricating a first mask having first patterns corresponding to the first respective patterns of the original mask layout, and a second mask having second patterns corresponding to the second respective patterns of the original mask layout, and
    wherein the fabricating of the second mask also includes checking a layout of the second patterns to ascertain whether closest ones of the second patterns are spaced a distance equal to at least twice the resolution, and forming in the second mask a dual pattern a region between closest ones of the second patterns determined by said checking to be spaced a distance at least twice the resolution, wherein the dual pattern corresponds to at least part of one of the first respective patterns of the original mask layout, and wherein contours of the first and second masks, which are simulated according to process variations, are substantially the same.

15. A method for use in manufacturing a semiconductor device, the method comprising:

generating an original mask layout including patterns between which a space is equal to or less than a resolution of a lithography process;

for each of the patterns, determining the shortest distance between the pattern and a pattern closest thereto in the layout;

apportioning the patterns among a plurality of layouts, respectively, based on whether the shortest distances between the patterns of the original mask layout are each greater than the resolution; and fabricating a plurality of masks, wherein the fabricating of the masks includes:

fabricating a first mask so as to have first patterns conforming to a first one of the layouts, fabricating a second mask so as to have second patterns conforming to a second one of the layouts, and so as to have a dual pattern whose size and shape are the same as those of at least part of one of the first patterns of the first mask, and such that the dual pattern is formed between one of the second patterns and another of the second patterns closest thereto at a relative location in the second mask corresponding to that of said one of the first patterns in the first mask, and wherein the shortest distance between said one and said other of the second patterns is equal to at least twice the resolution, whereby in a plan view in which the first and second masks are vertically aligned, the dual pattern of the second mask and said one of the first patterns of the first mask overlap.

16. The method of claim 15, further comprising checking the layout of patterns of each of the masks to determine whether the shortest distance between each of the patterns and the pattern closest thereto in the layout of the mask is greater than twice the resolution.

17. The method of claim 15, wherein the dual pattern of the second mask has the same size and shape as said one of the first patterns of the first mask.

18. The method of claim 15, wherein the dual pattern of the second mask has the size and shape of only a portion of said one of the first patterns of the first mask.

19. The method of claim 15, further comprising using all of said masks in a process of forming a pattern on a semiconductor substrate.

* * * * *